United States Patent
Yamanaka et al.

(10) Patent No.: US 7,189,488 B2
(45) Date of Patent: Mar. 13, 2007

(54) POLYIMIDE PRECURSOR, MANUFACTURING METHOD THEREOF, AND RESIN COMPOSITION USING POLYIMIDE PRECURSOR

(75) Inventors: Toshio Yamanaka, Settsu (JP); Koji Okada, Otsu (JP); Kaoru Takagahara, Settsu (JP)

(73) Assignee: Kaneka Corporation, Osaka (JP)

( * ) Notice: Subject to any disclaimer, the term of this patent is extended or adjusted under 35 U.S.C. 154(b) by 194 days.

(21) Appl. No.: 10/315,558

(22) Filed: Dec. 10, 2002

(65) Prior Publication Data

US 2003/0149142 A1  Aug. 7, 2003

(30) Foreign Application Priority Data

Dec. 11, 2001 (JP) ............................ 2001-377360
Feb. 20, 2002 (JP) ............................ 2002-042770

(51) Int. Cl.
*G03F 7/038* (2006.01)
*G03F 7/021* (2006.01)
*G03F 7/023* (2006.01)
*G03F 7/30* (2006.01)

(52) U.S. Cl. .................. 430/176; 430/189; 430/270.1; 430/176; 430/192; 430/197

(58) Field of Classification Search ............. 430/283.1, 430/175, 176, 192, 197, 18, 270.1, 189
See application file for complete search history.

(56) References Cited

U.S. PATENT DOCUMENTS

| | | | |
|---|---|---|---|
| 5,449,588 A * | 9/1995 | Maeda et al. ............. | 430/270.1 |
| 5,686,559 A | 11/1997 | Rhee et al. | |
| 5,952,448 A | 9/1999 | Lee et al. | |
| 6,159,654 A * | 12/2000 | Machida et al. ......... | 430/270.1 |
| 6,600,006 B2 * | 7/2003 | Jung et al. ................. | 528/353 |
| 2002/0093007 A1 * | 7/2002 | Handa et al. ............... | 252/500 |
| 2002/0093077 A1 * | 7/2002 | Jung et al. ................. | 257/642 |

FOREIGN PATENT DOCUMENTS

| | | |
|---|---|---|
| EP | 0541112 A1 * | 5/1993 |
| JP | 64-060630 | 3/1989 |
| JP | 01-108227 | 4/1989 |
| JP | 07-179604 | 7/1995 |
| JP | 06-208835 | 8/1996 |
| JP | 08-269198 | 10/1996 |
| JP | 09-176315 | 7/1997 |
| JP | 11-084645 | 3/1999 |
| JP | 2002-356555 | 12/2002 |
| JP | 2003-160664 | 6/2003 |

OTHER PUBLICATIONS

Ablaza, et al, "The efect of photoacid generator structure on deep ultraviolet resist performance", J. Vac. Sci. Technol. B 18(5), Sep./Oct. 2000 pp. 2543-2550.*
Frechet, Jean M.J. "The photogeneration of acid and base witin polymer coatins: Approaches to polymer curing and imaging", Pure & App. Chem. vol. 64, No. 9, pp. 1239-1248, year 1992.*
Szmanda et al "Measuring acid generation efficiency in Chemically apmplified resist with all three beams", J. Vac. Sci, Technol. B 17 (6), Nov./Dec. 1999, pp. 3356-3361.*
M. Oba, et al., "Synthesis and Evaluation of Positive-Acting Photosensitive Polyimides with Phenol Moiety" Journal of Applied Polymer Science, vol. 58, pp. 1535-1542, 1995.
T. Fukushima, et al., "Development of Positive Photosensitive Polyimide" The 13th Academic Meeting of Japanese Electronics Packaging, pp. 113-114, 1999.

* cited by examiner

*Primary Examiner*—Cynthia Hamilton
(74) *Attorney, Agent, or Firm*—Hogan & Hartson LLP

(57) ABSTRACT

A polyimide precursor in accordance with the present invention contains amide acid ester units, either imide units or amide acid units, and fluorine atoms bonded to some of these structural units. A polyimide precursor resin composition in accordance with the present invention contains either such a polyimide precursor or resins separately containing the structural units. Polyimide precursors in accordance with the present invention and resin compositions based on the same therefore have excellent properties and are suitably used in particular to form a particular pattern and for other purposes by impart photosensitivity to them.

6 Claims, No Drawings

POLYIMIDE PRECURSOR, MANUFACTURING METHOD THEREOF, AND RESIN COMPOSITION USING POLYIMIDE PRECURSOR

FIELD OF THE INVENTION

The present invention relates to polyimide precursors and their manufacturing methods, and resin compositions using the polyimide precursors, in particular to polyimide precursors which enables good pattern formation, especially which can be used for positive-type photosensitive material with excellent developing and other properties, and which can be suitable used for interlayer insulating film in various electric and electronic devices, in particular, semiconductor devices, buffer coat film, passivation film for liquid crystal display element, etc.; methods of manufacturing the polyimide precursors; and resin compositions using the polyimide precursors.

BACKGROUND OF THE INVENTION

Polyimide boasts excellent heat resistance among organic polymers and resins and is used for this reasons in widespread fields from space and aeronautics to electronic communications and office automation equipment. Further, researches are under way recently to impart use-specific functions in addition to heat resistance to polyimide.

For example, polyimide is popularly used in electronic communications, especially in semiconductor fields. Specific use of the material include coating of fine, patterned semiconductor circuits, that is, semiconductor chips. Accordingly, if photosensitivity is imparted to polyimide itself, polyimide film can be readily and finely patterned through light-exposure and development so as to match with a circuit. This enables simplification and shortening semiconductor manufacturing process. Accordingly, recently, photosensitive polyimide with photosensitivity as well as heat resistance has been developed and commercialized for a wide range of applications.

Incidentally, most conventional photosensitive polyimides are so-called negative types. Negative-type photosensitive polyimides are those which does not dissolve in developer liquid (organic solvent) if exposed to light.

Nevertheless, as photosensitive heat resistant resin, of which a typical example is photosensitive polyimide, positive types have better features than negative types, and their urgent development is a critical issue to many institutions. In comparison to negative types, positive-type photosensitive heat-resistance resins have following advantages (1) to (5) among others:

(1) With positive types, pin holes are unlikely to be formed. With negative types, if dust adheres, that portion is not exposed and therefore etched out, forming a hole and causing a break in the wire. With positive types, that portion covered by dust is not exposed and therefore forms no hole. Adverse effects of dust (parciles) are increasing with ongoing high integration wire pitch reduction and of LSI circuits. If dust adheres to the exposure mask, it shields that portion from radiation. Therefore, negative resist covered by dust is unexposed and dissolves, forming a hole. In contrast, positive resist covered by dust is unexposed, forming no hole.

(2) When a pattern is to be made, development is carried out to form forward taper, that is, the undissolved polyimide becomes thicker in the direction in which light is shone (thickness direction of the film).

(3) Resolution can be raised.

(4) Since no organic solvent is used, operational safety improves, and environment friendly.

(5) A facility of high performance can be installed.

As to Technologies regarding positive-type photosensitive heat-resistance resins, for example, ③ Japanese Unexamined Patent Application 8-269198/1996 (Tokukaihei 8-269198; published on Oct. 15, 1996) discloses a positive-type photosensitive resin made of a polybenzoxazole resin and a quinone diazide photosensitive agent.

Nevertheless, the photosensitive polyoxazole resin used in technology ③ is low in contrast and sensitivity, in comparison to typical positive-type resists (made of a novolak resin and a quinone diazide photosensitive agent) and therefore lacks sufficient practicality, which is a problem.

Examples of other technologies regarding positive-type photosensitive heat-resistance resins include ② and ③ described next. These technologies successfully produce positive-type photosensitive heat-resistance resins using a polyamide acid.

② J. Appl. Plym. Sci., 58 [9], pp. 1535–1542 (1995) discloses a resin in which an amino compound having a phenolic hydroxyl group is ion-bonded to a polyamide acid. By naphthoquinone diazide to the resin, a positive-type photosensitive heat-resistance resin can be obtained.

③ Japanese Unexamined Patent Application Tokukaihei 7-179604/1995 (Tokukaihei 7-179604; published on Jul. 18, 1995) discloses a resin in which a 1,4-dihydropyridine derivative is added as a photosensitive agent. As to the resin, a 1,4-dihydropyridine derivative mixed with a polyamide acid, and light is shone, before performing a heating treatment. At this time, exposed parts will have increased hydrophilicity and dissolve, because 1,4-dihydropyridine changes to pyridine which is basic.

Nevertheless, the polyamide acids used in technologies ② and ③ readily decompose through hydrolysis involving the water content of air. Therefore, the obtained photosensitive heat-resistance resins are unstable and have insufficient preservability and stability, which is a problem.

Further examples of other technologies regarding positive-type photosensitive heat-resistance resins include ④ to ⑦ described next. These technologies successfully produce positive-type photosensitive heat-resistance resins using a resin in which a polyamide acid is imidized, that is, a polyimide.

④ In the 13-th Conference of Japan Institute of Electronics Packaging, 113 (1999), Fukushima, et al. of Yokohama National University suggest a positive-type photosensitive polyimide in which naphthoquinone diazide is added to a polyimide having a carboxylic group in a side chain. The photosensitive polyimide can be UV sensitive and can be developed in an aqueous solution of tetramethyl ammonium hydroxide after UV light exposure.

⑤ Japanese Unexamined Patent Application 11-84645/1999 (Tokukaihei 11-84645; published on Mar. 26, 1999) discloses a composition of a positive-type photosensitive polyimide of which developed film does not swell, which has excellent photosensitivity, resolution, and film preserving property, and which does not require an intense heat treatment when cured as the finishing process. The composition has a phenolic hydroxyl group in its side chain, and made of an already imidized soluble polyimide and a photosensitive derivative of o-naphthoquinone diazide sulfonic acid.

⑥ Japanese Unexamined Patent Application 64-60630/1989 (Tokukaisho 64-60630; published on Mar. 7, 1989) and ⑦ Japanese Unexamined Patent Application 3-209478/1991 (Tokukaihei 3-209478; published on Sep. 12, 1991) disclose photosensitive resin compositions containing ortho quinone diazide and a polyimide with a hydroxy group, etc. introduced to an aromatic ring. It is reported that the photosensitive resin composition can be develop by an alkaline aqueous solution.

Because of the use of a polyimide, technologies ④ to ⑦ can improve storage stability, in comparison to technologies using a polyamide acid. Nevertheless, according to these technologies, most examples introduce a water-absorbing hydroxyl group or carboxylic group to a side chain of a polyimide. Therefore, the photosensitive polyimide or photosensitive resin composition will likely cause increased water absorbency, increased amounts of ionic impurities, and other problems.

For example, in technology ④, a carboxylic group is added to a polyimide in an attempt to improve developing property through an alkaline aqueous solution. Nevertheless, remaining carboxylic groups causes problems including increased water absorbency, increased amounts of ionic impurities, and low light sensitivity of about 1200 mJ/cm$^2$.

In technology ⑤, the resin structure contains remaining hydroxyl groups even after cured as the finishing process. Therefore, the technology will likely cause increased water absorbency and increased amounts of ionic impurities as will the case with technology ④.

Further, in technologies ⑥ and ⑦, the resin structures also contain remaining hydroxyl groups even after cured as the finishing process. Therefore, the technologies will not only possibly cause increased water absorbency and increased amounts of ionic impurities, but also lack sufficient post-curing alkaline resistance, heat resistance, and electrical properties, which is a problem. Besides, when technologies ⑥ and ⑦ are applied, especially, to semiconductor-related purposes, adhesion to substrates of silicon, etc. is insufficient. Therefore, unless the substrate is pre-treated using a silane coupling agent, etc., the resin peels off the substrate during development or after curing, which is also a problem. Further, to improve sensitivity, photosensitive material must be added in large quantities, which is a problem.

In this manner, conventional photosensitive heat-resistance resins have an issue of undesirably insufficient properties, especially, when applied to semiconductor-related purposes.

In view of the foregoing problems, the present invention has an objective to offer a polyimide precursor which exhibits excellent properties, in particular, photosensitivity which makes the precursor suitably used in the formation of a particular pattern; a manufacture method thereof; and a resin composition using the polyimide precursor.

SUMMARY OF THE INVENTION

The inventors have diligently and continuously worked on the problems and found a novel polyimide precursor having a particular structure which exhibits excellent properties and which, in particular when endowed with photosensitivity, can be suitably used for the formation of a particular pattern, completing the present invention.

Specifically, a polyimide precursor in accordance with the present invention is arranged to include:
at least one first structural unit (1); and
either at least one second structural unit (2) or at least one third structural unit (3),

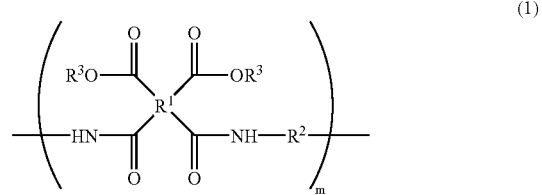

where $R^1$ is a tetravalent organic group, $R^2$ is a divalent organic group, $R^3$ is a monovalent organic group, and m is an integer greater than or equal to 1,

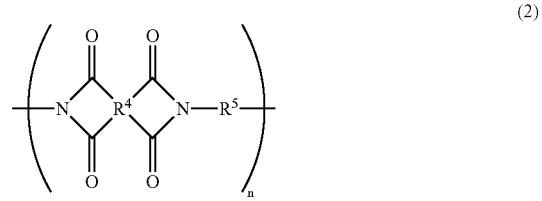

where $R^4$ is a tetravalent organic group, $R^5$ is a divalent organic group, and n is an integer greater than or equal to 1, and

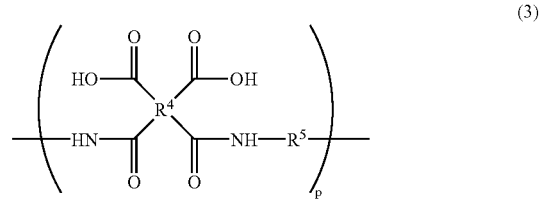

where $R^4$ is a tetravalent organic group, $R^5$ is a divalent organic group, and p is an integer greater than or equal to 1. The polyimide precursor is preferably such that at least one of organic groups $R^1$, $R^2$, $R^4$, and $R^5$ in the structural units is covalently bonded with a fluorine atom.

A polyimide precursor resin composition in accordance with the present invention is arranged to contain either (i) the above polyimide precursor or (ii) a polyimide precursor (A) containing at least one first structural unit (1) and at least either a polyimide (B) containing at least one second structural unit (2) or a polyamide acid (C) containing at least one third structural unit (3), wherein
at least one of organic groups $R^1$, $R^2$, $R^4$, and $R^5$ in the structural units is covalently bonded with a fluorine atom.

The polyimide precursor resin composition in accordance with the present invention preferably has photosensitivity. Specifically, it is more preferred if the polyimide precursor resin composition contains, for example, a photo acid generator and has positive-type photosensitivity.

A method of manufacturing a polyimide precursor in accordance with the present invention includes the step of synthesizing a polyamide acid by reacting a compound (4) having an amine end with at least one of two compounds (5) and (6) having an acid anhydride end,

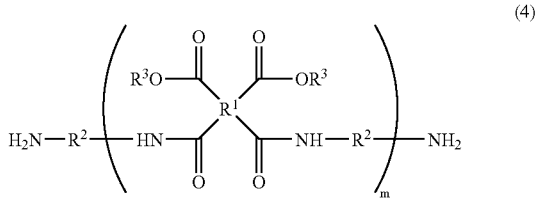

where $R^1$ is a tetravalent organic group, $R^2$ is a divalent organic group, $R^3$ is a monovalent organic group, and m is an integer greater than or equal to 1,

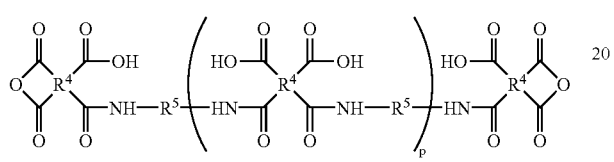

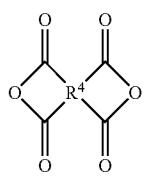

where each $R^4$ is a tetravalent organic group, each $R^5$ is a divalent organic group, and p is an integer greater than or equal to 1.

According to the arrangement, when photosensitivity is imparted by the containing of a photo acid generator, sensitivity and contrast, in particular, sensitivity to i beam, can be improved. Therefore, the resolution improves in the formation of a fine pattern.

According to the arrangement, even when photosensitivity is imparted, post-curing alkaline resistance, heat resistance, electrical properties, and adhesion can be improved.

As a result, a polyimide precursor in accordance with the present invention and a resin composition based thereon can exhibit excellent properties and can be suitably used in particular in the formation of a particular pattern.

For a fuller understanding of the nature and advantages of the invention, reference should be made to the ensuing detailed description.

DESCRIPTION OF THE EMBODIMENTS

The following will describe an embodiment of the present invention, which is by no means intended to be limiting the present invention.

The polyimide precursor in accordance with the present invention is a novel polymer having in its structure an esterified polyamide site and becomes polyimide which is imidized and shows heat resistance when heated. That is, the polyimide precursor in accordance with the present invention refers to a polymer which is imidized and becomes polyimide by heating. The polyimide precursor is capable of showing excellent properties, and with photosensitivity imparted thereto, can be suitably used as a photosensitive resin composition.

Therefore, the resin composition in accordance with the present invention contains at least the foregoing polyimide precursor, and can be suitably used particularly for the formation of a particular pattern. Further, the method of manufacturing a polyimide precursor in accordance with the present invention is a method of manufacturing the foregoing polyimide precursor which is a novel polymer.

<Polyimide Precursor>

The polyimide precursor in accordance with the present invention is a polymer containing at least first structural units represented by formula (1):

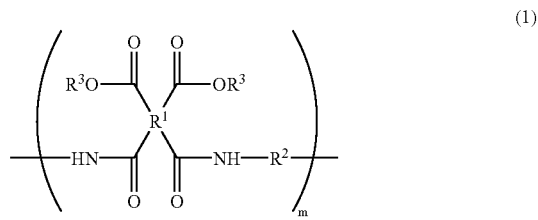

where $R^1$ is a tetravalent organic group, $R^2$ is a divalent organic group, $R^3$ is a monovalent organic group, and m is an integer greater than or equal to 1.

Further, the polyimide precursor in accordance with the present invention contains, as well as the first structural units, either second structural units represented by formula (2) or third structural units represented by formula (3):

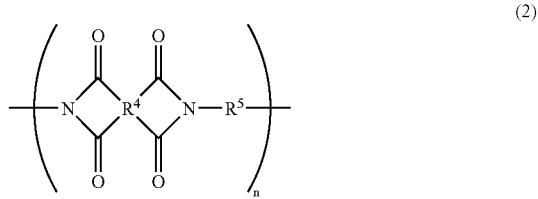

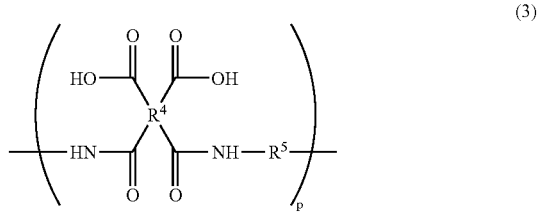

where each $R^4$ is a tetravalent organic group, each $R^5$ is a divalent organic group, and each n and p is an integer greater than or equal to 1.

The first structural unit is an esterified amide acid unit; to put it differently, the unit can be termed an amide acid ester unit. Further, the second structural unit is an imide unit containing an imide ring. The third structural unit is an amide acid unit.

Therefore, the polyimide precursor in accordance with the present invention is a polymer containing at least amide acid ester units (first structural units) and more specifically, may be either any copolymer containing (1) a copolymer containing amide acid ester units and imide units (second structural units) or (2) a copolymer containing amide acid ester units and polyamide acid units (third structural units). Each of copolymers (1), (2) may be of course a copolymer consisting only of two or more of the first to third structural units or a copolymer containing other structural units as well. In the description below, for convenience, copolymer (1) is termed the imide precursor, and copolymer (2) is termed the amide acid precursor.

The polyimide precursor in accordance with the present invention, as described in the foregoing, has an amide acid ester structure represented by formula (1) and therefore will exhibit improved, excellent solubility in a solvent. Besides, when compared to a polymer having only an amide acid structure, the polyimide precursor in accordance with the present invention will also exhibit excellent preservability and stability during storage.

Tetravalent organic groups $R^1$, $R^4$, and $R^6$ in formulae (1) and (2) are not limited in any particular manner; any suitable structure which exhibits preferable properties may be selectively employed according to the use of the polyimide precursor and the resin composition in accordance with the present invention. Similarly, divalent organic groups $R^2$, $R^5$ and $R^7$ in formulae (1) and (2) and monovalent organic group $R^3$ in formula (1) are not limited in any particular manner either; any structure which exhibits preferable properties may be selectively employed.

Further, it is preferred in the polyimide precursor in accordance with the present invention if at least one of organic groups $R^1$, $R^2$, $R^4$, and $R^5$ in formulae (1) and (2) is covalently bonded with a fluorine atom. In other words, it is preferred if organic groups $R^1$ to $R^5$, except for organic group $R^3$, in formulae (1) and (2) contains a fluorine atom it the structure thereof.

In this manner, if at least one of organic groups $R^1$, $R^2$, $R^4$, and $R^5$ has a structure covalently bonded with a fluorine atom, increases in the moisture absorbency of the associated polyimide can be prevented when the obtained polyimide precursor is heated to form a polyimide.

<Presence Ratio of Structural Units>

In the polyimide precursor in accordance with the present invention, it is more preferred if the ratio of structural units (1), (2) present in a polymer molecule is specified in a particular range.

Specifically, first, in the case of the foregoing imide precursor, the molecule contains therein the first structural units (amide acid ester units) and the second structural units (imide units). Accordingly, as to the presence ratios of these structural units, the number of the first structural units is specified preferably to a range of from 1% to 99%, more preferably to a range of from 5% to 95%, even more preferably to a range of from 10% to 90%, and much more preferably to a range of from 20% to 80%, of all the structural units in a polyimide precursor molecule.

Illustrating this by an equation, in the case of the foregoing imide precursor, the number of the first structural units among all the structural units in an associated imide precursor molecule is given by $a/(a+b)$ where $a$ and $b$ are the number of the first structural units and the number of the second structural units respectively in an associated imide precursor molecule. Accordingly, in the present invention, each of the presence ratios is specified preferably so that $a$ and $b$ are related by $0.01 \leq a/(a+b) \leq 0.99$, more preferably so that $a$ and $b$ are related by $0.05 \leq a/(a+b) \leq 0.95$, even more preferably so that $a$ and $b$ are related by $0.1 \leq a/(a+b) \leq 0.9$, and much more preferably so that $a$ and $b$ are related by $0.2 \leq a/(a+b) \leq 0.8$. Note that $a$ and $b$ are integers greater than or equal to 1.

Further, in the case of the foregoing amide acid precursor, the molecule contains therein the first structural units (amide acid ester units) and the third structural units (amide acid units). Accordingly, as to the presence ratios of these structural units, the number of the first structural units is specified preferably to a range of from 10% to 90%, more preferably to a range of from 20% to 80%, even more preferably to a range of from 30% to 70%, of all the structural units in an amide acid precursor molecule.

Illustrating this by an equation, the number of the first structural units among all the structural units in an associated amide acid precursor molecule is given by $a/(a+c)$ where $a$ and $c$ are the number of the first structural units and the number of the third structural units respectively in an amide acid precursor molecule. Accordingly, in the present invention, each of the presence ratios is specified preferably so that $a$ and $c$ are related by $0.1 \leq a/(a+c) \leq 0.9$, more preferably so that $a$ and $c$ are related by $0.2 \leq a/(a+c) \leq 0.8$, and even more preferably so that $a$ and $c$ are related by $0.3 \leq a/(a+c) \leq 0.7$. Note that $a$ and $c$ are integers greater than or equal to 1.

The following will describe reasons why it is preferable to specify the presence ratios of the structural units in a polyimide precursor molecule as described in the foregoing.

The first structural units, represented by formula (1), are amide acid ester units and therefore imidized when heated. As a result, a polyimide precursor containing such units becomes a heat resistant polyimide when heated.

Here, ester groups are removed from the first structural units by heating. Therefore, supposing that the polyimide precursor consists only of the first structural units, the removal of ester groups causes a great reduction in volume when imidized. When a resin composition in accordance with the present invention is applied to form a film, the volume reduction causes a reduction in the film thickness (termed film contraction). This also produces contractive stress. Further, when the polyimide precursor consists only of first structural units, the solubility in an alkaline aqueous solution becomes insufficient, and developing time becomes longer.

Accordingly, in the present invention, by specifying at least the presence ratio of the first structural units, a reduction in the film contraction and solubility can be prevented and a polyimide precursor exhibiting excellent properties can be obtained.

Meanwhile, the second structural units represented by formula (2) is a structure found in general polyimides. Polyimides consisting only of second structural units, that is, general polyimides, have a low solubility in a solvent.

Further, the third structural units represented by formula (3) is an amide acid structure. Polyamide acids consisting only of third structural units shows too great a solubility in an alkaline aqueous solution (developer liquid). Therefore, in the development, non-exposed parts erode, and film contraction, etc. occur due to an alkaline aqueous solution.

Accordingly, in the present invention, if the presence ratio of the first structural units is specified as in the foregoing for both the imide precursor and the amide acid precursor, the presence ratio of the remaining structural units, i.e., either the second structural units or the third structural units, can be specified. This enables a reduction in the solubility in a solvent and a situation where solubility grows too great to be prevented from occurring.

Therefore, as to the polyimide precursor in accordance with the present invention, the numbers of the structural units contained in the polyimide precursor only need to have at least either of the relationships represented by conditions (I), (II):

$$0.01 \leq a/(a+b) \leq 0.99 \quad \text{Condition (I)}$$

$$0.1 \leq a/(a+c) \leq 0.9 \quad \text{Condition (II)}$$

where a is the aforementioned number of the first structural units, b is the aforementioned number of the second structural units, and c is the aforementioned number of the third structural units.

Further, as will be described later in <Polyimide Precursor Resin Composition>, when more than one resin are used in a combination, a polymer (resin) may be used which consists only of first, second, or third structural units.

<Weight-Average Molecular Weight>

The weight-average molecular weight of the polyimide precursor in accordance with the present invention is not limited in any particular manner; however, the weight-average molecular weight is preferably in a range of from 5,000 to 300,000 and more preferably in a range of from 10,000 to 150,000 regardless of the type(s) of the structural unit(s) contained, be it an imide precursor, an amide acid precursor, or others. If the weight-average molecular weight of the polyimide precursor is too small, the molecular weight of the polyimide obtained by imidization falls, possibly making the resin composition containing the polyimide brittle. On the contrary, if the weight-average molecular weight is too great, the molecular weight of the polyimide obtained also grows too great, and the viscosity of the resin composition containing the polyimide grows too great, making it difficult to handle the polyimide.

The weight-average molecular weight is preferably measured by size exclusion chromatography. When this is the case, the specific value of the weight-average molecular weight can be obtained by drawing a quantity detection line by means of polystyrene, polyreneoxide, polyethylene glycol, or another standard substance and carrying out a conversion.

<Method of Manufacturing Polyimide Precursor>

The method of manufacturing the polyimide precursor in accordance with the present invention only needs to involve the step (polyamide acid synthesis step) of synthesizing a polyamide acid by reacting a compound having an amine end represented by formula (4) with at least one of compounds, having two acid anhydride ends, represented by formulae (5) and (6).

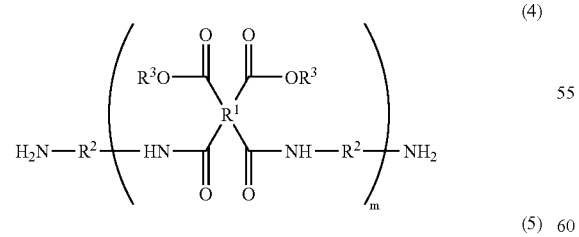

(4)

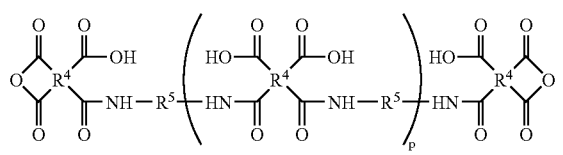

(5)

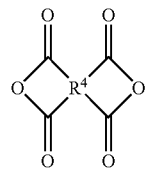

(6)

Note that in formulae (4) to (6), each $R^1$ and $R^4$ is a tetravalent organic group, each $R^2$ and $R^5$ is a divalent organic group, $R^3$ is a monovalent organic group, each m and p is an integer greater than or equal to 1. Further, for convenience, compound (4), having an amine end, is termed the amine-ended compound. Similarly, both compounds (5) and (6), having an acid anhydride end, are termed the acid-anhydride-ended compound.

Further, when the polyimide precursor in accordance with the present invention contains second structural units (imide units) represented by formula (2), the method of manufacturing the polyimide precursor in accordance with the present invention only needs to involve, in addition to the foregoing polyamide acid synthesis step, an imidization step of imidizing only the amide acid site of the polyamide acid obtained in the polyamide acid synthesis step. This enables the manufacture of the aforementioned polyimide precursor.

That is, according to the manufacturing method in accordance with the present invention, carrying out only the polyamide acid synthesis step will produce the aforementioned amide acid precursor, and further carrying out the imidization step will produce the aforementioned imide precursor.

A concrete example of a method of manufacturing an imide precursor among the foregoing polyimide precursors will be now described.

First, prepare an amine-ended compound represented by formula (4) and an acid-anhydride-ended compound represented by formula (5) through separate synthesis, and react the compounds in an aprotic solvent (amide acid synthesis step). The polyamide acid thus obtained is subjected to a reaction to imidize amide acid sites (imidization step). An imide precursor is thus obtained.

Alternatively, prepare an amine-ended compound represented by formula (4) and an acid-dianhydride-ended compound represented by formula (6) through separate synthesis, and react the compounds in an aprotic solvent (amide acid synthesis step). The polyamide acid thus obtained is subjected to a reaction to imidize amide acid sites (imidization step). An imide precursor is obtainable in this manner too.

A concrete example of a method of manufacturing an amide acid precursor among the aforementioned polyimide precursors will be now described.

First, prepare an amine-ended compound represented by formula (4) and an acid-anhydride-ended compound represented by formula (5) through separate synthesis, and react the compounds in an aprotic solvent (amide acid synthesis step). An amide acid precursor is thus obtained.

Alternatively, prepare an amine-ended compound represented by formula (4) and an acid-dianhydride-ended compound represented by formula (6) through separate synthesis, and react the compounds in an aprotic solvent (amide acid synthesis step). An amide acid precursor is obtainable in this manner too.

Further, as to both the imide precursor and the amide precursor, an acid-anhydride-ended compound represented by formula (5) and an acid-anhydride-ended compound represented by formula (6) may be used together.

An imide precursor or an amide precursor is also obtainable from a raw material compound represented by formula (7), which will be detailed later, an acid dianhydride, and an diamine compound by polymerizing them in such a manner that the combined moles of acid dianhydrides substantially equal the combined moles of diamine compounds.

<Method of Manufacturing Amine-ended Compound and Acid-anhydride-ended Compound>

The amine-ended compound represented by formula (4) can be manufactured using raw material compounds represented by formula (7):

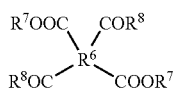  (7)

Note that $R^6$ in formula (7) only needs to be the same tetravalent organic group as $R^1$ in formula (4). Further, $R^7$ in formula (7) is a monovalent organic group containing a monovalent organic group indicated as $R^3$ in formula (4). Further, $R^8$ in formula (7) is an OH or Cl.

The method of manufacturing the raw material compound represented by formula (7) is not limited in any particular manner; the compound can be manufactured via any product.

First, when the group indicated by $R^8$ is an OH (hydroxyl group), the raw material compound represented by formula (7) is the diester compound represented by formula (7-1):

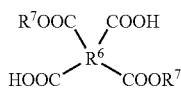  (7-1)

The diester compound can be manufactured by, for example, the method described next.

That is, dissolve an acid dianhydride containing the tetravalent organic group indicated by $R^6$ in a solvent, put an alcohol to mix, and place the mixture under a heating reflux. Then, after keeping the mixture reacting under a heating reflux for 0.2 hours to 24 hours, remove the solvent, so as to obtain the diester compound. The obtained diester compound may be refined, if necessary, by recrystallization, column chromatography separation, or another common refining method.

Next, when the group indicated by $R^8$ is a Cl (chorine atom), the raw material compound represented by formula (7) is the dichloride compound represented by formula (7-2):

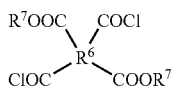  (7-2)

The dichloride compound can be manufactured by, for example, the method described next.

That is, suspend the diester compound in a solvent made of ethyl acetate, etc., add thionyl chloride or oxalyl chloride twice the equivalent amount of the ester compounds, and add a small amount of dimethyl formamide. Then place the solution under a reflux of, for example, 40° C. so as to keep the solution reacting under the heating reflux for 0.5 hours to 48 hours. Keep, if necessary, the solution reacting under the heating reflux for another 0.5 hours to 48 hours to complete the reaction. Then, remove the solvent under a reduced pressure, and if necessary, dry the residue under a reduced pressure, so as to obtain the dichloride compound. The obtained dichloride compound may be refined, if necessary, by a common refining method, such as recrystallization.

Considering versatility of the obtained polyimide precursor and film contraction after imidization, the monovalent organic group indicated by $R^7$ in the raw material compound represented by formula (7) contains preferably 1 to 7 carbon atoms and more preferably 1 to 5 carbon atoms.

The amine-ended compound represented by formula (4) is obtainable by using the dichloride compound represented by formula (7-2) and the diamine compound represented by formula (8) as monomer constituents, mixing these compounds, and reacting the mixture in an aprotic solvent:

  (8)

where $R^2$ in formula (8) is identical to $R^2$ in formula (1). Under these circumstances, by carrying out synthesis while supplying excess moles of the diamine compound to be reacted in comparison to the moles of the dichloride compound represented by formula (7-2), the amine-ended compound represented by formula (4), that is, an amide oligomer with an amino group at both ends, is obtained.

Further, the amine-ended compound represented by formula (4) is obtainable by using the diester compound represented by formula (7-1), a condensing agent at least twice the equivalent amount of the diester compound, and the diamine compound represented by formula (8) as monomer constituents, mixing them, and reacting the mixture in an aprotic solvent. Under these circumstances, by carrying out synthesis while supplying excess moles of the diamine compound to be reacted in comparison to the moles of the diester compound represented by formula (7-1), the amine-ended compound represented by formula (4), that is, an amide oligomer with an amino group at both ends, is obtained.

Next, the acid-anhydride-ended compound represented by formula (5) is obtainable by using the diamine compound represented by formula (9) and the acid dianhydride represented by formula (10) and reacting these compounds in an aprotic solvent:

  (9)

  (10)

where $R^5$ in formula (9) is identical to $R^5$ in formula (2) and $R^4$ in formula (10) is an identical divalent organic group to $R^4$ in formula (2). Under these circumstances, by carrying out synthesis while supplying excess moles the acid dianhydride to be reacted in comparison to the moles of the diamine compound, the acid-anhydride-ended compound represented by formula (5), that is, an amide acid oligomer with an acid anhydride at both ends, is obtained.

<Diamine Compound>

The diamine compounds represented by formulae (8) and (9), although not being limited in any particular manner, are preferably those compounds in which, even if they are a diamine compound, structures corresponding to the aforementioned organic groups contain (are covalently bonded with) a fluorine atom, because as mentioned in the foregoing, at least one of the organic groups indicated by $R^1$, $R^2$, $R^4$, and $R^5$ in formulae (1) to (3) is preferably covalently bonded with a fluorine atom.

Specific examples include 4-(1H,1H,11H-eicosafluoro undecanoxy)-1,3-diaminobenzene, 4-(1H,1H-perfluoro-1-butanoxy)-1,3-diaminobenzene, 4-(1H,1H-perfluoro-1-heptanoxy)-1,3-diaminobenzene, 4-(1H,1H-perfluoro-1-octanoxy)-1,3-diaminobenzene, 4-pentafluorophenoxy-1,3-diaminobenzene, 4-(2,3,5,6-tetrafluorophenoxy)-1,3-diaminobenzene, 4-(4-fluorophenoxy)-1,3-diaminobenzene, 4-(1H,1H,2H,2H-perfluoro-1-hexanoxy)-1,3-diaminobenzene, 4-(1H, 1H,2H,2H-perfluoro-1-dodecanoxy)-1,3-diaminobenzene, (2,5)-diaminobenzotrifluoride, bis(trifluoromethyl)phenylenediamine, diamino tetra(trifluoromethyl) benzene, diamino(pentafluoroethyl)benzene, 2,5-diamino (perfluorohexyl)benzene, 2,5-diamino(perfluorobutyl) benzene, 2,2'-bis(trifluoromethyl)-4,4'-diaminobiphenyl, 3,3'-bis(trifluoromethyl)-4,4'-diaminobiphenyl, octafluorobenzidine, 4,4'-diaminodiphenylether, 2,2-bis(4-aminophenyl)hexafluoropropane, 1,3-bis(anilino)hexafluoropropane, 1,4-bis(anilino)octafluorobutane, 1,5-bis(anilino) decafluoropentane, 1,7-bis(anilino)tetradecafluoroheptane, 2,2'-bis(trifluoromethyl)-4,4'-diaminodiphenylether, 3,3'-bis (trifluoromethyl)-4,4'-diaminodiphenylether, 3,3',5,5'-tetrakis(trifluoromethyl)-4,4'-diaminodiphenylether, 3,3'-bis (trifluoromethyl)-4,4'-diaminobenzophenone, 4,4'-diamino-p-terphenyl, 1,4-bis(p-aminophenyl)benzene, p-(4-amino-2-trifluoromethylphenoxy)benzene, bis(aminophenoxy)bis (trifluoromethyl)benzene, bis(aminophenoxy)tetrakis (trifluoromethyl)benzene, 2,2-bis{4-(4-aminophenoxy) phenyl}hexafluoropropane, 2,2-bis{4-(3-aminophenoxy) phenyl}hexafluoropropane, 2,2-bis{4-(2-aminophenoxy) phenyl}hexafluoropropane, 2,2-bis{4-(4-aminophenoxy)-3, 5-dimethylphenyl}hexafluoropropane, 2,2-bis{4-(4-aminophenoxy)-3,5-ditrifluoromethylphenyl}hexafluoropropane, 4,4'-bis(4-amino-2-trifluoromethylphenoxy)biphenyl, 4,4'-bis(4-amino-3-trifluoromethylphenoxy)biphenyl, 4,4'-bis(4-amino-2-trifluoromethylphenoxy)diphenylsulfone, 4,4'-bis (3-amino-5-trifluoromethylphenoxy)diphenylsulfone, 2,2-bis{4-(4-amino-3-trifluoromethylphenoxy) phenyl}hexafluoropropane, bis{(trifluoromethyl) aminophenoxy}biphenyl, bis[{(trifluoromethyl) aminophenoxy}phenyl]hexafluoropropane, bis{2-[(aminophenoxy)phenyl]hexafluoroisopropyl}benzene, and 4,4'-bis(4-aminophenoxy)octafluorobiphenyl, but are not limited to these compounds.

Further, the diamine compounds represented by formulae (8) and (9) may be compounds containing a fluorine atom as mentioned in the foregoing, and may be those which do not contain a fluorine atom (which are not covalently bonded with a fluorine atom).

Specific examples include 4,4'-diaminodiphenylether, 4,4'-diaminodiphenylsulfone, 4,4'-diaminodiphenyl sulfide, benzidine, methaphenylenediamine, paraphenylenediamine, 1,5-naphthalenediamine, 2,6-naphthalenediamine, bis-(4-aminophenoxyphenyl)sulfone, bis-(4-aminophenoxyphenyl)sulfide, bis-(4-aminophenoxyphenyl)biphenyl, 1,4-bis-(4-aminophenoxy)benzene, 1,3-bis-(4-aminophenoxy) benzene, 3,4'-diaminodiphenylether, 4,4'-diaminodiphenylether-3-sulfone amide, 3,4'-diaminodiphenylether-4-sulfone amide, 3,4'-diaminodiphenylether-3'-sulfone amide, 3,3'-diaminodiphenylether-4-sulfone amide, 4,4'-diaminodiphenylsulfone-3-sulfone amide, 3,4'-diaminodiphenylsulfone-4-sulfone amide, 3,4'-diaminodiphenylsulfone-3'-sulfone amide, 3,3'-diaminodiphenylsulfone-4-sulfone amide, 4,4'-diaminodiphenyl sulfide-3-sulfone amide, 3,4'-diaminodiphenyl sulfide-4-sulfone amide, 3,3'-diaminodiphenyl sulfide-4-sulfone amide, 3,4'-diaminodiphenyl sulfide-3'-sulfone amide, 1,4-diaminobenzene-2-sulfone amide, 4,4'-diaminodiphenylether-3-carbonamide, 3,4'-diaminodiphenylether-4-carbonamide, 3,4'-diaminodiphenylether-3-carbonamide, 3,3'-diaminodiphenylether-4-carbonamide, 4,4'-diaminodiphenylmethane-3-carbonamide, 3,4'-diaminodiphenylmethane-4-carbonamide, 3,4'-diaminodiphenylmethane-3'-carbonamide, 3,3'-diaminodiphenylmethane-4-carbonamide, 4,4'-diaminodiphenylsulfone-3-carbonamide, 3,4'-diaminodiphenylsulfone-4-carbonamide, 3,4'-diaminodiphenylsulfone-3'-carbon amide, 3,3-diaminodiphenylsulfone-4-carbonamide, 4,4'-diaminodiphenyl sulfide-3-carbonamide, 3,4'-diaminodiphenyl sulfide-4-carbonamide, 3,3'-diaminodiphenyl sulfide-4-carbonamide, 3,4'-diaminodiphenyl sulfide-3'-sulfone amide, 1,4-diaminobenzene-2-carbonamide, 4,4'-bis(4-aminophenoxy) biphenyl, and bis{4-(3-aminophenoxy)phenyl}sulfone, but are not limited to these compounds.

Any one of the diamine compounds may be used alone, or alternatively two or more of them may be used together in any combination, regardless whether any or no fluorine atoms are contained.

<Acid Dianhydride>

Similarly to the foregoing diamine compounds, the acid dianhydride represented by formula (10), although not being limited in any particular manner, are preferably those compounds in which even if they are an acid dianhydride, structures corresponding to the aforementioned organic groups contain (are covalently bonded with) a fluorine atom, because as mentioned in the foregoing, at least one of the organic groups indicated by $R^1$, $R^2$, $R^4$, and $R^5$ in formulae (1) to (3) is preferably covalently bonded with a fluorine atom.

Specific examples include (trifluoromethyl)pyromellitic dianhydride, di(trifluoromethyl)pyromellitic dianhydride, di(heptafluoropropyl)pyromellitic dianhydride, pentafluoroethyl pyromellitic dianhydride, bis{3,5-di(trifluoromethyl) phenoxy}pyromellitic dianhydride, 2,2-bis(3,4-dicarboxyphenyl)hexafluoropropane dianhydride, 5,5'-bis (trifluoromethyl)-3,3',4,4'-tetracarboxybiphenyl dianhydride, 2,2',5,5'-tetrakis(trifluoromethyl)-3,3',4,4'-tetracarboxybiphenyl dianhydride, 5,5'-bis(trifluoromethyl)-3,3',4,4'-tetracarboxydiphenylether dianhydride, 5,5'-bis(trifluoromethyl)-3,3',4,4'-tetracarboxybenzophenone dianhydride, bis{(trifluoromethyl) dicarboxyphenoxy}benzene dianhydride, bis{(trifluoromethyl)dicarboxyphenoxy}trifluoromethylbenzene dianhydride, bis(dicarboxyphenoxy)trifluoromethylbenzene dianhydride, bis(dicarboxyphenoxy)bis(trifluoromethyl) benzene dianhydride, bis(dicarboxyphenoxy)tetrakis(trifluoromethyl)benzene dianhydride, 2,2-bis{(4-(3,4-dicarboxyphenoxy)phenyl)hexafluoropropane dianhydride, bis{

(trifluoromethyl)dicarboxyphenoxy}biphenyl dianhydride, bis{(trifluoromethyl)dicarboxyphenoxy}bis(trifluoromethyl)biphenyl dianhydride, bis{(trifluoromethyl) dicarboxyphenoxy}diphenylether dianhydride, and bis(dicarboxyphenoxy)bis(trifluoromethyl)biphenyl dianhydride, but are not limited to these compounds.

Further, the acid dianhydrides represented by formula (10) may be compounds containing a fluorine atom and may be those which do not contain a fluorine atom (which are not covalently bonded with a fluorine atom).

Specific examples include para-terphenyl-3,4,3'',4''-tetracarboxylic dianhydride, pyromellitic dianhydride, 3,3',4,4'-benzophenone tetracarboxylic dianhydride, 1,4-hydroquinone dibenzoate-3,3',4,4'-tetracarboxylic dianhydride, 3,3',4,4'-biphenyl tetracarboxylic dianhydride, 3,3',4,4'-biphenylether tetracarboxylic dianhydride, 1,2,5,6-naphthalene tetracarboxylic dianhydride, 2,3,6,7-naphthalene tetracarboxylic dianhydride, 2,3,5,6-pyridine tetracarboxylic dianhydride, 1,4,5,8-naphthalene tetracarboxylic dianhydride, 3,4,9,10-perylene tetracarboxylic dianhydride, 4,4'-sulfonyl diphthalic dianhydride, 3,3',4,4'-tetraphenyl silane tetracarboxylic dianhydride, metha-terphenyl-3,3'',4,4''-tetracarboxylic dianhydride, 3,3',4,4'-diphenylether tetracarboxylic dianhydride, 1,3-bis(3,4-dicarboxyphenyl)-1,1,3,3-tetramethyl disiloxane dianhydride, and 1-(2,3-dicarboxyphenyl)-3-(3,4-dicarboxyphenyl)-1,1,3,3-tetramethyl disiloxane dianhydride, but are not limited to these compounds.

Any one of the acid dianhydrides may be used alone, or alternatively two or more of them may be used together in any combination, regardless whether any or no fluorine atoms are contained.

<Especially Preferred Combination of Compounds>

If is especially preferable if the raw material compounds represented by formula (7), the diamine compounds represented by formulae (8) and (9), and the acid dianhydrides represented by formula (10) are combined as in the following examples.

(1) Especially preferred combination examples to manufacture an imide precursor.

(1-1) Raw material compounds: diester compounds prepared by synthesis of 2,2-bis(3,4-dicarboxyphenyl) hexafluoropropane dianhydride or pyromellitic dianhydride, dichloride compounds, or mixtures of these compounds.

(1-2) Diamine compounds: 2,2'-bis(trifluoromethyl)-4,4'-diaminobiphenyl, 4,4'-diaminodiphenylether, or mixtures of these compounds.

(1-3) Acid dianhydrides: 2,2-bis(3,4-dicarboxyphenyl) hexafluoropropane dianhydride, pyromellitic dianhydride, or mixtures of these compounds.

(2) Especially preferred combination examples to manufacture an amide acid precursor.

(2-1) Raw material compounds: diester compounds prepared by synthesis of 2,2-bis(3,4-dicarboxyphenyl) hexafluoropropane dianhydride, pyromellitic dianhydride, 4,4'-oxydiphthalic dianhydride, or 3,3',4,4'-benzophenone tetracarboxylic dianhydride, dichloride compounds, or mixtures of these compounds.

(2-2) Diamine compounds: 2,2'-ditrifluoromethylbenzidine, 4,4'-diaminodiphenylether (2-3) Acid dianhydrides: 2,2-bis(3,4-dicarboxyphenyl) hexafluoropropane dianhydride, pyromellitic dianhydride, 4,4'-oxydiphthalic dianhydride, 3,3',4,4'-benzophenone tetracarboxylic dianhydride, or mixtures of these compounds Using one of these combinations is preferred for various reasons, which include that such a combination imparts excellent solubility in a solvent to obtained polyimide precursors and facilitates the synthesis of the dichloride compounds and/or the diester compounds. Further, among the combinations, a compound containing a fluorine atom is preferably used as at least one compound, because such a compound reduces the moisture absorbency of the obtained polyimide precursor (and polyimide).

<Condensing Agent>

The condensing agent used to manufacture the amine-ended compound represented by formula (4) using the diester compound formula (7-1) and the diamine compound represented by formula (8) is not limited in any particular manner and suitably a conventionally known compound, etc which is used for condensation synthesis of polyamide.

Specific examples include DCC (dicyclohexylhexyl carbodiimide); hypophosphite esters, such as triphenyl hypophosphite and its derivatives; phosphorus chloride, such as phosphorus trichloride and phosphorus oxychloride; phosphoric amides, such as 2,3-dihydro-2-thioxo-3-benzoxazolyl phosphonic acid; phosphoric ester; and phosphoric anhydride. Any one of the condensing agents may be used alone, or alternatively two or more of them may be used together in combination.

The condensing agent, as mentioned above, only needs to be added at an amount equivalent to two to three times that of the diester compound represented by formula (7-1), preferably 2.1 times to 2.3 times. Besides the foregoing condensing agents, pyridine, triethylamine, etc. may be added to improve reactivity of the condensation reaction, where necessary. Normally, the amounts of the pyridine, triethylamine, etc. added only needs to be equivalent to that of the condensing agent added.

<Solvent Used for Manufacture of Polyimide Precursor>

The aprotic solvent used for the manufacture of the foregoing polyimide precursors are not limited in any particular manner. Examples include sulfoxide solvents, such as dimethyl sulfoxide and diethyl sulfoxide; formamide solvents, such as N,N-dimethyl formamide and N,N-diethyl formamide; acetamide solvents, such as N,N-dimethyl acetamide and N,N-diethyl acetamide; pyrolidone solvents, such as N-methyl-2-pyrolidone and N-vinyl-2-pyrolidone; hexamethyl phosphoramide; and γ-butyrolactone.

Any one of the solvents may be used alone, or alternatively two or more of them may be mixed for use as a mixture. Further, aromatic hydrocarbons, such as xylene and toluene, may be partially used together. The amounts of the aromatic hydrocarbons are not limited in any particular manner, so long as they do not affect the manufacture of the polyimide precursor.

<Imidization>

An imidization step carried out as in the foregoing in the aforementioned method of manufacturing the polyimide precursor, in particular, in cases where an imidized precursors is manufactured. The imidization method used for this purpose is not limited in any particular manner; a preferable method is to imidize while removing water. When a polyamide acid is imidized, water is produced, readily hydrolyze the polyamide acid and thereby reducing the molecular weight. For these reasons, the method of imidization while removing water is preferably used.

Specific methods of imidization include (1) a method to actively discharge the produced water out of the system by adding an azeotropic solvent, such as toluene, and (2) a chemical imidization method to cause reaction in the presence of a dehydrating ring-closing agent, preferably of a dehydrating ring-closing agent and a catalyst; the chemical imidization method (2) is more preferred.

Specific examples of the dehydrating ring-closing agent used in the chemical imidize method include acid anhydrides, such as aliphatic anhydrides and aromatic anhydrides; N,N'-dialkylcarbodiimide; and halides, such as lower aliphatic halides, halogenated lower aliphatic halides, halogenated lower aliphatic anhydrides, aryl phosphonic acid dihalides, and thionyl halides. Any one of the dehydrating ring-closing agents may be used, or alternatively two or more of them may be used in combination.

Among the dehydrating ring-closing agents, aliphatic anhydrides, such as acetic anhydride, propionic anhydride, and lac anhydride, are preferably used. Two or more of these aliphatic anhydrides may also be used in combination.

The amount of the dehydrating ring-closing agent added only needs to be in a range of from of 1 to 10 times that of the moles of the amide acid sites in the polyamide acid which is to be imidized, preferably 1 to 7 times, and more preferably 2 to 5 times. If the amount of the dehydrating ring-closing agent added is less than 1 time the moles, imidization does not efficiently progress, which is not economically preferable. In contrast, if the amount exceeds 10 times the moles, the properties of the obtained polyimide precursor will possibly be degraded; other inconveniences may also occur.

In the chemical imidize method, to efficiently carry out imidization, combined use of the dehydrating ring-closing agent and a catalyst is preferred. Specific examples of the catalysts include aliphatic tertiary amines, aromatic tertiary amines, and heterocycic tertiary amines. Among them, heterocycic tertiary amines are especially preferably used: more specifically, quinoline, isoquinoline, β-picoline, pyridine, and pyridine derivatives.

The amount of the foregoing catalyst added is within a range of from 1/20 to 10 times the amount (moles) of the dehydrating ring-closing agent, preferably within a range of from 1/15 to 5 times, and more preferably within a range of from 1/10 to 2 times. If the amount of the catalyst added is below 1/20 times, the imidization does not efficiently progress, which is not economically preferable. In contrast, if the amount exceeds 10 times, the properties of the obtained polyimide precursor will possibly be degraded; other inconveniences may also occur.

The temperature in the imidization according to the chemical imidize method is preferably within a range of from 20° C. to 150° C. If the temperature is below 20° C., the imidization may take too much time. In contrast, if the temperature exceeds 150° C., the ester parts of the polyamide acid are also imidized, and a desired polyimide precursor (imide precursor) may not be obtained.

<Polyimide Precursor Resin Composition>

The polyimide precursor resin composition in accordance with the present invention only needs to include, in the constituent resin (polymer), the first structural units represented by formula (1) and at least either the second structural units represented by formula (2) or the third structural units represented by formula (3). In other words, in the polyimide precursor resin composition in accordance with the present invention, the structural units represented by formulae (1), (2), and (3) may be present in the same molecule or in different molecules.

Therefore, the polyimide precursor resin composition in accordance with the present invention is, for example, (1) a resin composition containing a polyimide precursor containing at least either one of the aforementioned polyimide precursor, that is, the aforementioned first structural units or the second or the third structural units or (2) a resin composition containing a resin containing the aforementioned first structural units and either a resin containing the second structural units or a resin containing the third structural units. Note that in the following description, the "polyimide precursor resin composition" will be referred to simply as the "resin composition" for convenience, unless otherwise stated.

The polyimide precursors contained in the resin composition (1) are as described in the foregoing, and detailed description thereof is omitted here.

Specific description of the resin composition (2) follows. The resin composition in accordance with the present invention only needs to contain at least one of (A) the polyimide precursor containing the first structural units (amide acid ester units) represented by formula (1), (B) the polyimide containing the second structural units (imide units) represented by formula (2), and (C) the polyamide acid containing the third structural units (amide acid units) represented by formula (3).

Similarly to the aforementioned polyimide precursors, as to the three resins (A) to (C), at least one of organic groups, contained in the resin, which are indicated by $R^1$, $R^2$, $R^4$, and $R^5$ in formulae (1) to (3) only needs to covalently bonded with a fluorine atom.

Further, similarly to the aforementioned polyimide precursor, it is preferred if the three resins (A) to (C) are mixed so that the numbers of structural units have at least either of the relationships represented by conditions (I), (II)

$$0.01 \leq a/(a+b) \leq 0.99 \qquad \text{Condition (I)}$$

$$0.1 \leq a/(a+c) \leq 0.9 \qquad \text{Condition (II)}$$

where a is the number of the first structural units in polyimide precursor (A), b is the number of the second structural units in polyimide (B), and c is the number of the third structural units in polyamide acid (C).

Note that the same more preferred relationship between conditions (I) and (II) stands as in the case of the aforementioned polyimide precursor. Specifically, as to condition (I), it is more preferred if the mix ratio of the resins is specified so that $0.05 \leq a/(a+b) \leq 0.95$, even more preferably if it is specified so that $0.1 \leq a/(a+b) \leq 0.9$, and much more preferred if it is specified so that $0.2 \leq a/(a+b) \leq 0.8$.

Similarly, as to condition (II), it is more preferred if the mix ratio of the resins is specified so that $0.2 \leq a/(a+c) \leq 0.8$ and even more preferred if it is specified so that $0.3 \leq a/(a+c) \leq 0.7$.

Note that any of polyimide precursor (A), polyimide (B), and polyamide acid (C) may contain structural units other than the first, second, and third structural units. That is, polyimide precursor (A), polyimide (B), and polyamide acid (C) may be polymers which contain only the first, second, and third structural units respectively or copolymers which contain structures derived from other monomer constituents (the polyimide (B) contains a structure derived from a diamine compound).

Further, for example, two copolymers which contain the first and second structural units and of which the presence ratios of the structural units differ may be used in combination so that the presence ratio of the structural units falls within the aforementioned range, to obtain a copolymer mixture.

The resin composition in accordance with the present invention may of course include not only resins in combination (A) and (B) or in combination (A) and (C), but also all resins (A) to (C).

Therefore, the resin composition in accordance with the present invention only needs to contain two or more resins in combination so as to include the first structural units represented by formula (1) and either the second structural units represented by formula (2) or the third structural units represented by formula (3).

Note that the method of manufacturing resins (A) to (C) is basically similar to the aforementioned method of manufacturing the polyimide precursor, and its description is omitted here. Further, in the following, for convenience, polyimide precursor (A) and either polyimide (B) or polyamide acid (C) (or both) are collectively referred to as polyimide resin components.

<Solvent Used in Resin Composition>

The resin composition in accordance with the present invention may be made into a solution by dissolving the polyimide precursor or the polyimide resin components (resins (A) to (C)) in a suitable solvent. As will be described later in detail, when the resin composition in accordance with the present invention is used, for example, semiconductor-related purposes, as a photosensitive heat-resistance resin composition, it is preferred to provide it in the form of solution for easy handling and workability.

Here is an example of preparing the resin composition in accordance with the present invention as a solution. First, a polyimide precursor solution (reaction solution) synthesized using the aforementioned monomer constituent is introduced to deionized water or alcohol, for example, to precipitate a polyimide precursor. Thereafter, the polyimide precursor is further wash in deionized water, alcohol, etc. where necessary and dried under a reduced pressure. Then, various solvents are added to the obtained polyimide precursor to dissolve and disperse the polyimide precursor, producing a solution of the resin composition.

Further, synthesized reaction solution may be used as such without carrying out the precipitate step, etc., or a solution of the resin composition may be prepared by removing part of the solvent as required.

The solvent used to prepare the resin composition in the form of solution is not limited in any particular manner, so long as the solvent is able to dissolve and disperse the polyimide precursor or polyimide resin components.

Specific examples include solvents of an alcohol, such as methanol, ethanol, propanol, isopropanol, butanol, or pentanol; solvents of a ketone, such as acetone or methyl ethyl ketone; solvents of an ester, such as ethyl acetate; solvents of an ether, such as dimethyl ether, tetrahydrofuran, or dioxane; solvents of a nitrile, such as acetonitrile; solvents of an aromatic hydrocarbon, such as toluene or xylene; solvents of an aliphatic hydrocarbon, such as hexane, heptane, octane, or cyclohexane; solvents of halogenated hydrocarbon, such as methylene chloride; solvents of a sulfoxide, such as dimethyl sulfoxide or diethyl sulfoxide; solvents of a formamide, such as N,N-dimethyl formamide or N,N-diethyl formamide; solvents of an acetamide, such as N,N-dimethyl acetamide or N,N-diethyl acetamide; solvents of a pyrolidone, such as N-methyl-2-pyrolidone; solvents of a phenol, such as phenol, o-, p-, or m-cresol, xynol, halogenated phenol, or catechol; hexamethyl phosphoramide; or γ-butyrolactone.

Any of these solvents may be used alone, or alternatively, two or more of them may be mixed for use as a mixture. In particular, in cases where the resin composition is used to form a film or thin film, two or more of the solvents may be mixed for use for purposes to improve uniformity and adjustment in thickness of such a film or thin film and adhesion of the film or thin film.

When the resin composition in accordance with the present invention is provided in the form of solution, the concentration of solids in the resin composition is preferably within a range of from 1 wt % to 95 wt %, more preferably within a range of from 10 wt % to 70 wt %. If the concentration of solids exceeds 95 wt %, the resin composition has too high viscosity and is unsuitable to the formation (printing, etc.) of a film and thin film. In contrast, if it is below 1 wt %, the viscosity is too low, making the resin composition unsuitable for the formation (printing, etc.) of a film or thin film or rendering the film too thin.

<Imparting Photosensitivity>

The resin composition in accordance with the present invention preferably has photosensitivity, more preferably positive-type photosensitivity in particular. Positive-type photosensitive resin compositions have advantages in comparison to negative types as mentioned in the foregoing. Some of the advantages are as in (1) to (5) below:

(1) With positive types, pin holes are unlikely to be formed. With negative types, if dust adheres, that portion is not exposed and therefore etched out, forming a hole and causing a break in the wire. With positive types, that portion covered by dust is not exposed and therefore forms no hole. Adverse effects of dust (parciles) are increasing with on-going high integration wire pitch reduction and of LSI circuits. If dust adheres to the exposure mask, it shields that portion from radiation. Therefore, negative resist covered by dust is unexposed and dissolves, forming a hole. In contrast, positive resist covered by dust is unexposed, forming no hole.

(2) In pattern formation, development can be carried out to produce forward taper, that is, for undissolved polyimide to broaden in the direction in which light is shone (in the film's thickness direction);

(3) Resolution can be improved;

(4) No organic solvent is used, which gives better operational safety and makes the compositions more environment friendly; and (5) A facility with high treatment efficiency be made.

For these reasons, when the resin composition in accordance with the present invention has positive-type photosensitivity, the composition can be suitably used, for example, in electronic communications fields, particularly in semiconductor-related purposes, etc.

Although not being limited in any particular manner, the method of imparting photosensitivity to the resin composition in accordance with the present invention is preferably a method based on the use of a photo acid generator to impart positive-type photosensitivity. The photo acid generator is not limited in any particular manner, so long as it is a compound which produces acid on illumination by light: a more preferred compound is a compound which produces sulfonic acid or carboxylic acid.

Specific examples of sulfonic-acid-producing compounds include iodonium salts, sulfonium salts, and onium salts. Further, examples of carboxylic-acid-producing compounds include naphthoquinone diazide. Alternatively, diazonium salts, bis(trichloromethyl)triazines, and like compounds are preferably used, because they produce sulfone groups on illumination by light.

The amount of the photo acid generator added is not limited in any particular manner; it is however preferred if 0.3 to 50 weight parts of the agent is added to every combined 100 weight parts of the polyimide precursor or polyimide resin components in the resin composition in accordance with the present invention.

Specifically, (1) when the polyimide precursor is an imide precursor or when the aforementioned two resins, that is, polyimide precursor (A) and polyimide (B), are used in combination as the polyimide resin components, the photo acid generator needs to be contained at 0.3 to 50 wt % to the combined amount of the polyimide precursor or polyimide resin components.

Further, (2) when the polyimide precursor is an amide acid precursor or when the aforementioned two resins, that is, polyimide precursor (A) and polyamide acid (C), are used in combination as the polyimide resin components, the foregoing photo acid generator needs to be contained at 1 to 50 wt % to the combined amount of the polyimide precursor or polyimide resin components.

If the amount of the photo acid generator added is below 0.3 weight parts in every combined 100 weight parts of the polyimide precursor or polyimide resin components, the added amount becomes too small, failing to produce sufficient acid on illumination by light; the photo acid generator does not serve expected function. As a result, the resin composition shows poor resolution. In contrast, if the amount of the photo acid generator added exceeds 50 weight parts, too much of the photo acid generator is used; when the resin composition is formed into film or a thin film, the resulting film degrades not only in dielectricity, mechanical strength, heat resistance, and other properties, but also in optical transmittance, which makes it difficult to form a hole through a thin film or film by light exposure and development.

<Photosensitizer>

The resin composition in accordance with the present invention may contain a photosensitizer as well as the aforesaid photo acid generator. The addition of a photosensitizer allows improvement of photosensitivity of the resin composition.

Specific examples of such photosensitizers include Michler's keton, bis-4,4'-diethylaminobenzophenone, benzophenone, camphor quinone, benzyl, 4,4'-dimethylaminobenzyl, 3,5-bis (diethylaminobenzylidene)-N-methyl-4-piperidone, 3,5-bis(dimethylaminobenzylidene)-N-methyl-4-piperidone, 3,5-bis(diethylaminobenzylidene)-N-ethyl-4-piperidone, 3,3'-carbonyl bis(7-diethylamino)coumarin, riboflavin tetrabutylate, 2-methyl-1-[4-(methyl thio)phenyl]-2-morpholinopropane-1-on, 2,4-dimethyl thioxantone, 2,4-diethyl thioxantone, 2,4-diisopropyl thioxantone, 3,5-dimethyl thioxantone, 3,5-diisopropyl thioxantone, 1-phenyl-2-(ethoxycarbonyl)oxyiminopropane-1-on, benzoin ether, benzoin isopropyl ether, benzanthrone, 5-nitroacenaphthene, 2-nitrofluorene, anthrone, 1,2-benzanthraquinone, 1-phenyl-5-mercapto-1H-tetrazole, thioxanthen-9-on, 10-thioxanthnone, 3-acetylindole, 2,6-di(p-dimethylaminobenzal)-4-carboxycyclohexanone, 2,6-di(p-dimethylaminobenzal)-4-hydroxycyclohexanone, 2,6-di(p-diethylaminobenzal)-4-carboxycyclohexanone, 2,6-di(p-diethylaminobenzal)-4-hydroxycyclohexanone, 4,6-dimethyl-7-ethylamino coumarin, 7-diethylamino-4-methyl coumarin, 7-diethylamino-3-(1-methylbenzoimidazolyl) coumarin, 3-(2-benzoimidazolyl)-7-diethylamino coumarin, 3-(2-benzothiazolyl)-7-diethylamino coumarin, 2-(p-dimethylaminostyryl)benzoxazole, 2-(p-dimethylaminostyryl) quinoline, 4-(p-dimethylaminostyryl)quinoline, 2-(p-dimethylaminostyryl)zenzothiazole, and 2-(p-dimethylaminostyryl)-3,3-dimethyl-3H-indole, but are not limited to these compounds. Any of these photosensitizers may be used alone, or alternatively two or more of them may be used in combination.

The amount of the photosensitizer added, although not being limited in any particular manner, is preferably within a range of from 1 to 50 weight parts per every combined 100 weight parts of the polyimide precursor or polyimide resin components in the resin composition in accordance with the present invention, more preferably within a range of from 1 to 20 weight parts. If the amount of the photosensitizer added is out of the 1 to 50 weight parts range, sensitivity enhancing effects may not be achieved and/or developing properties may be adversely affected.

<Photopolymerization Auxiliary Agent>

The resin composition in accordance with the present invention may contain a photopolymerization auxiliary agent as well as the photo acid generator and the photosensitizer. The further addition of a photopolymerization auxiliary agent also allows improvement of photosensitivity of the resin composition.

Specific examples of such photopolymerization auxiliary agents include 4-diethylamino ethylbenzoate, 4-dimethylamino ethylbenzoate, 4-diethylamino propylbenzoate, 4-dimethylamino propylbenzoate, 4-dimethylamino isoamylbenzoate, N-phenylglycine, N-methyl-N-phenylglycine, N-(4-cyanophenyl)glycine, 4-dimethylaminobenzonitrile, ethylene glycol dithioglycolate, ethylene glycol di(3-mercaptopropionate), trimethylolpropane thioglycolate, trimethylolpropane tri(3-mercaptopropionate), pentaerythritol tetrathioglycolate, pentaerythritol tetra(3-mercaptopropionate), trimethylolethane trithioglycolate, trimethylolpropane trithioglycolate, trimethylolethane tri(3-mercaptopropionate), dipentaerythritol hexa(3-mercaptopropionate), thioglycolate, α-mercaptopropionate, t-butyl peroxybenzoate, t-butyl peroxymethoxybenzoate, t-butyl peroxynitrobenzoate, t-butyl peroxyethylbenzoate, phenyl isopropyl peroxybenzoate, di t-butyl diperoxyisophthalate, tri t-butyl triperoxytrimellitate, tri t-butyl triperoxytrimesitate, tetra t-butyl tetraperoxypyromellitate, 2,5-dimethyl-2,5-di(benzoylperoxy)hexane, 3,3',4,4'-tetra(t-butyl peroxycarbonyl)benzophenone, 3,3,4,4'-tetra(t-amyl peroxycarbonyl)benzophenone, 3,3',4,4'-tetra(t-hexyl peroxycarbonyl) benzophenone, 2,6-di(p-azide benzal)-4-hydroxycyclohexanone, 2,6-di(p-azide benzal)-4-carboxycyclohexanone, 2,6-di(p-azide benzal)-4-methoxycyclohexanone, 2,6-di(p-azide benzal)-4-hydroxy methylcyclohexanone, 3,5-di(p-azide benzal)-1-methyl-4-piperidone, 3,5-di(p-azide benzal)-4-piperidone, 3,5-di(p-azibenzal)-N-acetyl-4-piperidone, 3,5-di(p-azide benzal)-N-methoxycarbonyl-4-piperidone, 2,6-di(p-azide benzal)-4-hydroxycyclohexanone, 2,6-di(m-azide benzal)-4-carboxycyclohexanone, 2,6-di(m-azide benzal)-4-methoxycyclohexanone, 2,6-di(m-azide benzal)-4-hydroxy methylcyclohexanone, 3,5-di(m-azide benzal)-N-methyl-4-piperidone, 3,5-di(m-azide benzal)-4-piperidone, 3,5-di(m-azide benzal)-N-acetyl-4-piperidone, 3,5-di(m-azide benzal)-N-methoxycarbonyl-4-piperidone, 2,6-di(p-azide cinnamylidene)-4-hydroxycyclohexanone, 2,6-di(p-azide cinnamylidene)-4-carboxycyclohexanone, 2,6-di(p-azide cinnamylidene)-4-cyclohexanone, 3,5-di(p-azide cinnamylidene)-N-methyl-4-piperidone, 4,4'-diazide chalcone, 3,3'-diazide chalcone, 3,4'-diazide chalcone, 4,3'-diazide chalcone, 1,3-diphenyl-1,2,3-propane trion-2-(o-acetyl)

oxym, 1,3-diphenyl-1,2,3-propane trion-2-(o-n-propyl carbonyl)oxym, 1,3-diphenyl-1,2,3-propane trion-2-(o-methoxycarbonyl)oxym, 1,3-diphenyl-1,2,3-propane trion-2-(o-ethoxycarbonyl)oxym, 1,3-diphenyl-1,2,3-propane trion-2-(o-benzoyl)oxym, 1,3-diphenyl-1,2,3-propane trion-2-(o-phenyl oxycarbonyl)oxym, 1,3-bis(p-methyl phenyl)-1,2,3-propane trion-2-(o-benzoyl)oxym, 1,3-bis(p-methoxyphenyl)-1,2,3-propane trion-2-(o-ethoxycarbonyl) oxym, and 1-(p-methoxyphenyl)-3-(p-nitrophenyl)-1,2,3-propane trion-2-(o-phenyl oxycarbonyl)oxym, but are not limited to these compounds. Any one of these photopolymerization auxiliary agents may used alone, or alternatively two or more of them may be used in combination.

The amount of the photopolymerization auxiliary agent added, although not being limited in any particular manner, is preferably within a range of from 0.1 to 50 weight parts per every combined 100 weight parts of the polyimide precursor or polyimide resin components in the resin composition in accordance with the present invention, more preferably within a range of from 0.3 to 20 weight parts. If the amount of the photopolymerization auxiliary agent added is out of the 0.1 to 50 weight parts range, target sensitivity enhancing effects may not be achieved and/or developing properties may be adversely affected.

<Method of Forming Particular Pattern>

The resin composition in accordance with the present invention can be formed into film of particular patterns by, for example, fabricating it into thin film on a desired object and exposing and developing it with light. Note that for convenience in description, a film with a particular pattern will be referred to as a patterned film.

That is, the method of manufacturing a patterned film in accordance with the present invention is not limited in any particular manner, provided that the resin composition is fabricated into film, reactive light is subsequently shone from above a mask on which a particular pattern is drawn, and then those parts which have been illuminated by the light are developed and removed.

The method of forming a thin film on an object is not limited in any particular manner, and conventionally known methods may be applied. For example, if the resin composition in accordance with the present invention is a solution, a coating method widely used in the electronics field, such as spin coating, bar coating, or doctor blade, may be employed.

The drying temperature at which the thin film is formed is not limited in any particular manner either; generally, suitable temperatures are within a range of from 40° C. to 150° C. If the drying temperature is extremely low, the drying takes longer, which is not desirable. Further, if the drying temperature is extremely high, acid sensitive groups in the polyimide precursor or polyimide resin components decompose thermally, which is not desirable. Note that preferred drying temperature varies depending on the kind of the solvent and drying and other conditions, and therefore is not necessarily limited to the foregoing range.

The object on which the thin film is formed is not limited in any particular manner. That is, the object is not limited in any particular manner in terms of shape, composition, usage, etc., provided that it allows the formation of the thin film.

For example, in the aforementioned electronic communications and semiconductor-related fields, the object is a substrate on which a thin film is formed of the resin composition in accordance with the present invention. The shape of the substrate may be like a plate with some thickness or thinner film. The composition of the substrate may be, for example, silicon, metal, ceramics, or resin (polymer); therefore, substrates that can be used as an object in the present invention include silicon wafers, metal substrates, ceramic substrate, and high molecular substrates.

Among these, specific examples of materials for the high molecular substrates include polyimide resin, polyamide imide resin, polyether imide resin, polyamide resin, polyester resin, polycarbonate resin, polyketone resin, polysulfone resin, polyphenylene ether resin, polyolefin resin, polystyrene resin, polyphenylene sulfide resin, fluorine resin, polyarylate resin, liquid crystal polymer resin, epoxy resin, and cyanate resin. Note that polyimide resin, epoxy resin, and cyanate resin can be preferably used for better heat resistance, adhesion, etc.

<Exposure and Development>

In the present invention, as described in the forgoing, the resin composition having photosensitivity is fabricated into film, reactive light is subsequently shone from above a mask on which a particular pattern is drawn, and then those parts which have been illuminated by the light are developed and removed. That is, in the present invention, a patterned film is formed by exposuring and developing a thin film of a photosensitive resin composition.

Here, in exposing the resin composition in accordance with the present invention, visible to ultraviolet wavelengths from 200 nm to 500 nm are used. The specific exposure device is not limited in any particular manner; any exposure device (photolithography machine) may be used which is able to shine visible to ultraviolet wavelengths of light in the range. Exposure devices equipped with a monochromatic filter are preferred, because such exposure devices have advantages in resolving power and workability during exposure. In the present invention, the exposure process is not of course limited by particular exposure equipment.

Exposure time is not limited in any particular manner either. An ultraviolet light exposure device equipped with a 365 nm filter may be used under various conditions, in which case the monochrome light shone is an i beam. In this case, exposure time can be varied within a range of from 5 to 240 seconds. Therefore, a powerful exposure device can cut down exposure time. Exposure energy is measured using an energy measuring instrument, and resolving power can be checked using a profile instrument in terms of depth and width. Further, the cross section of the thin film can be checked with an electron microscope.

By developing the thin film of the exposed resin composition with a developer liquid, non-exposed parts are dissolved and removed. In cases where the resin composition in accordance with the present invention is developed, an alkaline aqueous solution (alkaline aqueous solution) is used as the developer liquid.

Specific examples of the alkaline substance (basic substance) used for the alkaline aqueous solution includes inorganic alkalis, such as sodium hydroxide, potassium hydroxide, sodium silicate, and ammonia; primary amines, such as ethylamine and propylamine; secondary amines, such as diethylamine and dipropylamine; tertiary amines, such as trimethylamine and triethylamine; alcohol amines, such as diethyl ethanol amine and triethanol amine; and quaternary ammonium salts, such as tetramethyl ammonium hydroxide, tetraethyl ammonium hydroxide, trimethyl hydroxy methyl ammonium hydroxide, triethyl hydroxy methyl ammonium hydroxide, and trimethyl hydroxy ethyl ammonium hydroxide, but are not limited in any particular manner. Any one of the alkaline substances may be used alone, or alternatively two or more of them may be used in combination.

To the alkaline aqueous solution, water-soluble organic solvents, such as methanol, ethanol, propanol, or ethylene glycol; various surface active agents, various preservatives, resin dissolution inhibiting agents, and other additives can be added if necessary. The amount of the additive added is not limited in any particular manner and suitably specified according to the kind of the alkaline aqueous solution, developing conditions, and resin composition.

<Imidization of Polyamide Precursor>

The resin composition in accordance with the present invention can be fabricated into a patterned film through the foregoing exposure and development. Sufficient heat resistance can be imparted to the patterned film through heating. That is, if the polyimide precursor contained in the resin composition in accordance with the present invention is heated after exposure and development, those parts of the polyimide precursor which can be imidized are all imidized, and the resin composition can be polyimided. This imparts sufficient heat resistance (specifically, heat resistance to 260° C. or higher).

Heating conditions under which the polyimide precursor is imidized are not limited in any particular manner, but heating temperature is preferably within a range of from 200° C. to 500° C. If the heating temperature is below 200° C., the polyimide precursor possibly cannot be imidized; if the heating temperature exceeds 500° C., the polyimide precursor possibly can degrade. Neither of the cases is desirable. Further, in heating, temperature is preferably raised in stages. Such temperature increase is advantages in that the patterned film is unlikely to deform and that mechanical strength improves, and therefore preferable.

Among other heating conditions, heating time is not limited in any particular manner either, but preferably within a range of from 0.1 to 10 hours. Further, the atmosphere of heating is not limited in any particular manner either. Heating can be carried out in air without any problems, but preferably should be carried out under a nitrogen, helium, argon, or other inert gas atmosphere or in vacuum.

In this manner, the polyimide precursor and polyimide resin components in accordance with the present invention have the first structural units represented by formula (1) and hence no polyamide acid structure which is problematic in preservability and stability, and contain many esterified structures. Besides, in a final state, no water-absorbing hydroxyl group or carboxylic group is required to be present in a side chain. Therefore, a polyimide resin composition can be offered which is low in water absorbency and excellent in preservability and stability.

Further, the resin composition in accordance with the present invention exhibits positive-type photosensitivity, because a photo acid generator is added to it. Besides, high sensitivity and high resolution can be achieved. The resin composition in particular in accordance with the present invention is highly sensitive to reactive beams of light, especially, i beam, can form a good pattern.

Further, the resin composition in accordance with the present invention can be etched by an alkaline aqueous solution, because it contains the aforementioned polyimide precursor or polyimide resin components. Therefore, a patterned film can be carried out in a good manner through exposure and development using a photomask having a predetermined pattern. Besides, even if the photomask pattern is minute, the resolution in development is excellent, and therefore a fine patterned film can be formed. Further, the adhesion of the obtained patterned film to an object can be improved.

EXAMPLES

The following will describe the present invention more specifically by way of examples, which is by no means intended to be limiting to the present invention.

<Raw Materials Used>

Raw materials used in the examples are commercially available products. Details follow. Sales agents or manufactures are shown in parentheses.

2,2'-ditrifluoromethylbenzidine (Central Glass, Co., Ltd.)
Pyromellitic dianhydride (Wako Pure Chemical Industries, Ltd.)
2,2-bis(3,4-dicarboxyphenyl)hexafluoropropane acid dianhydride (Clarient Japan Co., Ltd.)
4,4'-oxydiphthalic dianhydride (Manac Inc.)
Methanol (Wako Pure Chemical Industries, Ltd.)
Ethanol (Wako Pure Chemical Industries, Ltd.)
Ethyl acetate (Wako Pure Chemical Industries, Ltd.)
Thionyl chloride (Wako Pure Chemical Industries, Ltd.)
Hexane (Wako Pure Chemical Industries, Ltd.)

<Measuring Weight-Average Molecular Weight>

In the examples, the weight-average molecular weights of obtained resins (polymers) are measured by size exclusion chromatography and calculated through a conversion using a standard polystyrene quantity detection line.

<Synthesis of Pyromellitic Diethyl Chloride>

20.0 g (92 mmol) pyromellitic dianhydride and 100 ml ethanol were introduced into a three-neck flask equipped with a reflux tube and heated under a nitrogen atmosphere while continuously stirring, so as to carry out reflux stirring for 3 hours. After cooling the product to room temperature, the solvent was removed by an evaporator, and the residue was dried in vacuum to form particles.

The obtained particles were dissolved in 110 ml ethyl acetate, and 0.01 g dimethyl formamide was added. 27.1 g (230 mmol) thionyl chloride was further added, and reflux was carried out for 5 hours. After cooling the product to room temperature, the solvent was removed by an evaporator, and the residue was dried in vacuum to form particles.

The obtained particles were recrystallized using 80 ml hexane containing 0.25 g thionyl chloride. 22.5 g pyromellitic diethyl dichloride was thus obtained. Spectrum data of the obtained pyromellitic diethyl chloride are as follows:

$^1$H NMR (Solvent: $CDCl_3$): δ 1.4 (6H, t, $CH_3$), 4.4 (4H, q, $CH_2$), 8.2 (2H, s, benzene ring)

$^{13}$C NMR (Solvent: $CDCl_3$): δ 13.7, 63.3, 129.0, 132.1, 139.7, 163.5, 166.7

<Synthesis of Pyromellitic Diisopropyl Dichloride>

10.0 g (46 mmol) pyromellitic dianhydride and 50 ml isopropanol were introduced into a three-neck flask equipped with a reflux tube and heated under a nitrogen atmosphere while continuously stirring, so as to carry out reflux stirring for 3 hours. After cooling the product to room temperature, the solvent was removed by an evaporator, and the residue was dried in vacuum to form particles.

The obtained particles were dissolved in 60 ml ethyl acetate, and 0.01 g dimethyl formamide was added. 13.1 g (110.4 mmol) thionyl chloride was further added, and reflux was carried out for 5 hours. After cooling the product to room temperature, the solvent was removed by an evaporator, and the residue was dried in vacuum to form particles in a viscous liquid.

The obtained particles were recrystallized using 50 ml hexane containing 0.15 g thionyl chloride. 3.5 g pyromellitic diisopropyl dichloride was thus obtained. Spectrum data of the obtained pyromellitic diisopropyl dichloride are as follows:

1H NMR (Solvent: CDCl$_3$): δ 1.4 (12H, d, CH$_3$), 4.4 (2H, m, CH$_2$), 8.2 (2H, s, benzene ring)

$^{13}$C NMR (Solvent: CDCl$_3$): δ 21.9, 68.3, 129.0, 132.1, 139.7, 163.5, 166.7

Example 1

<Synthesis of Polyimide Precursor>

6.64 g (20.7 mmol) 2,2'-ditrifluoromethylbenzidine was introduced into a reaction container and dissolved by adding 80 g N-methylpyrolidone and 2.10 g (20.7 mmol) triethylamine. The reaction solution was cooled in ice bath. 3.59 g (10.4 mmol) pyromellitic diethyl dichloride dissolved in 9.0 g tetrahydrofuran was added while stirring and keeping the temperature of the reaction solution at 0° C. Thereafter, the content was stirred at 0° C. for 1 hour and then at 25° C. for 3 hours.

4.60 g (10.4 mmol) 2,2-bis(3,4-dicarboxyphenyl)hexafluoropropane acid dianhydride was added to the reaction solution and stirred at room temperature for 5 hours, so as to obtain a viscous polyamide acid ester-polyimide copolymer acid solution. 10.59 g (104 mmol) acetic anhydride and 2.15 g (20.7 mmol) β-picoline were added to the copolymer solution as a chemical cure agent (dehydrating ring-closing agent and catalyst). The content was stirred at room temperature for 2 hours and then at 100° C. for 1 hour, before cooled down to room temperature.

The solution was added to 1000 ml methanol. The precipitated resin content was ground by a mixer, and thereafter washed in methanol using a Soxhlet as the solvent and dried, to obtain 14.3 g polyimide precursor (imide precursor). The polyimide precursor had a weight-average molecular weight of 34,000, and its structure is represented by formula (11) below:

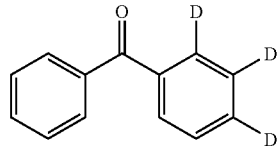

(12)

where D is an organic group identified by formula (13):

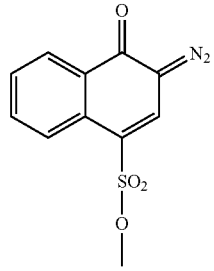

(13)

Thereafter, the content was filtered with a membrane filter to obtain a resin composition (having positive-type photosensitivity) in the form of solution in accordance with the present invention.

The obtained resin composition solution was directly applied onto a silicon wafer using a spin coater, dried at 100° C. for 30 minutes, to obtain a 5 μm-thick coating film. The film was exposed to light from a metal halide lamp (365 nm: 540 mJ/cm$^2$, 405 nm: 900 mJ/cm$^2$) through a photomask, using a desktop UV exposure device (Product No. 26-1KS, manufactured by Newark Electronics).

After the exposure, the coating film was thermally treated at 100° C. for 30 minutes to develop it. As a developer liquid, an alkaline aqueous solution was used which was composed of a 2 mol/l (2 N) aqueous solution of sodium hydroxide, a 5% aqueous solution of potassium hydroxide,

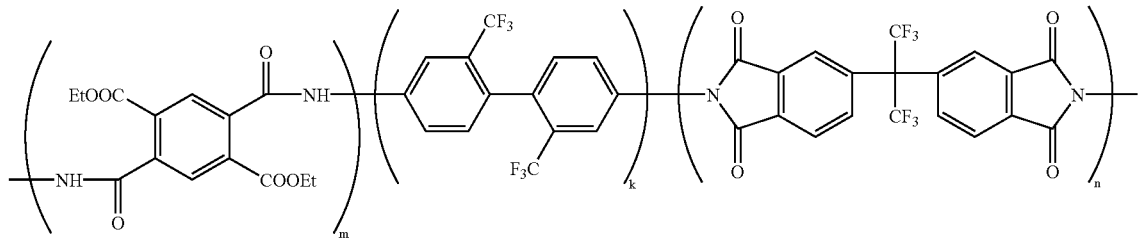

(11)

where each of k, m, and n is an integer greater than or equal to 1.

<Preparation and Evaluation of Resin Composition>.

0.7 g of the foregoing polyimide precursor was dissolved in 6.3 g N-methylpyrolidone, and a 0.3 g photo acid generator represented by formula (12) was added. The content was stirred at room temperature for 1 hour.

and a 1% aqueous solution of tetramethyl ammonium hydroxide. The coating film was immersed in the alkaline aqueous solution at 40° C. for 10 minutes. This completely confirmed that only the exposed parts had been eluted. After the development, the coating film was rinsed, and the obtained patterned film was checked for thickness and resolution, which turned out to be 4.5 μm and 10 μm respectively. It was thus concluded that a good pattern was produced.

Example 2

<Synthesis of Polyimide Precursor>

3.20 g (10.0 mmol) 2,2'-ditrifluoromethylbenzidine was introduced into a reaction container and dissolved by adding 35 g N-methylpyrolidone and 1.06 g (10.5 mmol) triethylamine. The reaction solution was cooled in ice bath. 1.74 g (5.0 mmol) pyromellitic diisopropyl dichloride dissolved in 5.0 g tetrahydrofuran was added while stirring and keeping the temperature of the reaction solution at 0° C. Thereafter, the content was stirred at 0° C. for 1 hour and then at 25° C. for 3 hours.

2.22 g (5.0 mmol) 2,2-bis(3,4-dicarboxyphenyl)hexafluoropropane acid dianhydride was added to the reaction solution and stirred at room temperature for 5 hours, so as to obtain a viscous polyamide acid ester-polyimide acid copolymer solution. 0.93 g (10 mmol) acetic anhydride and 6.125 g (60 mmol) β-picoline were added to the copolymer solution as a chemical cure agent (dehydrating ring-closing agent and catalyst). The content was stirred at room temperature for 2 hours and then at 100° C. for 1 hour, before cooled down to room temperature.

The solution was added to 500 ml methanol. The precipitated resin content was ground by a mixer, and thereafter, washed in methanol using a Soxhlet as the solvent and dried, to obtain 7.3 g polyimide precursor (imide precursor). The polyimide precursor had a weight-average molecular weight of 36,000, and its structure is shown in formula (14) below:

lamp (365 nm: 540 mJ/cm$^2$, 405 nm: 900 mJ/cm$^2$) through a photomask, using a desktop UV exposure device (Product No. 26-1KS, manufactured by Newark Electronics).

After the exposure, the coating film was thermally treated at 100° C. for 30 minutes to develop it. As a developer liquid, an alkaline aqueous solution was used which was composed of a 2 mol/l (2 N) aqueous solution of sodium hydroxide, a 5% aqueous solution of potassium hydroxide, and a 1% aqueous solution of tetramethyl ammonium hydroxide. The coating film was immersed in the alkaline aqueous solution at 40° C. for 10 minutes. This completely confirmed that only the exposed parts had been eluted. After the development, the coating film was rinsed, and the obtained patterned film was checked for thickness and resolution, which turned out to be 4.5 μm and 10 μm respectively. It was thus concluded that a good pattern was produced.

Example 3

<Synthesis of Polyimide Precursor>

6.64 g (20.7 mmol) 2,2'-ditrifluoromethylbenzidine was introduced into a reaction container and dissolved by adding 80 g N-methylpyrolidone and 2.10 g (20.7 mmol) triethylamine. The reaction solution was cooled in ice bath. 3.59 g (10.4 mmol) pyromellitic diethyl dichloride dissolved in 9.0 g tetrahydrofuran was added while stirring and keeping the

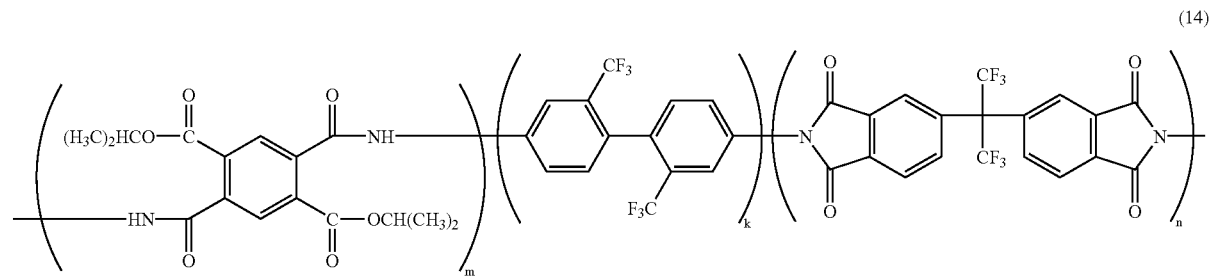

(14)

where each of k, m, and n is an integer greater than or equal to 1.

<Preparation and Evaluation of Resin Composition>

0.7 g of the foregoing polyimide precursor was dissolved in 6.3 g N-methylpyrolidone, and a 0.3 g photo acid generator represented by formula (12) was added. The content was stirred at room temperature for 1 hour. Thereafter, the content was filtered with a membrane filter to obtain a resin composition (having positive-type photosensitivity) in the form of solution in accordance with the present invention.

The obtained resin composition solution was directly applied onto a silicon wafer using a spin coater, dried at 100° C. for 30 minutes, to obtain a 5 μm-thick coating film (thin film). The film was exposed to light from a metal halide temperature of the reaction solution at 0° C. Thereafter, the content was stirred at 0° C. for 1 hour and then at 25° C. for 3 hours.

4.60 g (10.4 mmol) 2,2-bis(3,4-dicarboxyphenyl) hexafluoropropane acid dianhydride was added to the reaction solution and stirred at room temperature for 5 hours, so as to obtain a viscous polyamide acid ester-polyamide acid copolymer solution.

The copolymer solution was added to 1000 ml of a mix solvent of methanol and water (methanol/water=1/1 in volume). The precipitated resin content was ground by a mixer, and thereafter, washed in methanol, and dried, to obtain 15.1 g polyimide precursor (amide acid precursor). The polyimide precursor had a weight-average molecular weight of 37,000, and its structure is shown in formula (15) below:

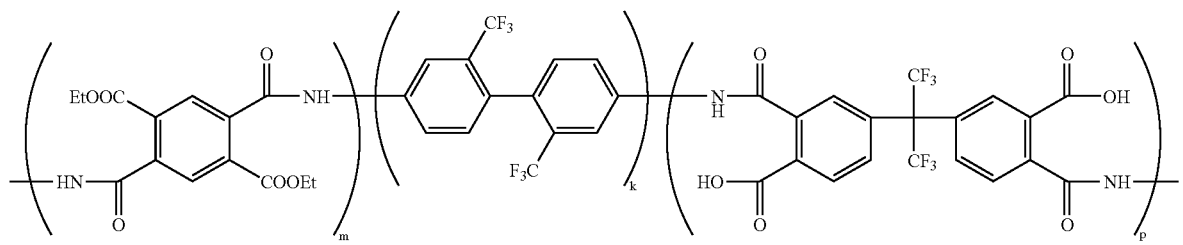

(15)

where each of k, m, and p is an integer greater than or equal to 1.

<Preparation and Evaluation of Resin Composition>

0.7 g of the foregoing polyimide precursor was dissolved in 6.3 g N-methylpyrolidone, and a 0.3 g photo acid generator represented by formula (12) was added. The content was stirred at room temperature for 1 hour. Thereafter, the content was filtered with a membrane filter to obtain a resin composition (having positive-type photosensitivity) in the form of solution in accordance with the present invention.

The obtained resin composition solution was directly applied onto a silicon wafer using a spin coater, dried at 100° C. for 30 minutes, to obtain a 5 μm-thick coating film (thin film). The film was exposed to light from a metal halide lamp (365 nm: 180 mJ/cm$^2$, 405 nm: 300 mJ/cm$^2$) through a photomask, using a desktop UV exposure device (Product No. 26-1KS, manufactured by Newark Electronics).

After the exposure, the coating film thermally treated at 100° C. for 30 minutes to develop it. As a developer liquid, an alkaline aqueous solution was used which was composed of a 2 mol/l (2 N) aqueous solution of sodium hydroxide, a 5% aqueous solution of potassium hydroxide, and a 1% aqueous solution of tetramethyl ammonium hydroxide. The coating film was immersed in the alkaline aqueous solution at 40° C. for 10 minutes. This completely confirmed that only the exposed parts had been eluted. After the development, the coating film was rinsed, and the obtained patterned film was checked for thickness and resolution, which turned out to be 4.6 pm and 10 pm respectively. It was thus concluded that a good pattern was produced.

Example 4

<Synthesis of Polyimide Precursor>

3.20 g (10.0 mmol) 2,2'-ditrifluoromethylbenzidine was introduced into a reaction container and dissolve by adding 35 g N-methylpyrolidone and 1.06 g (10.5 mmol) triethylamine. The reaction solution was cooled in ice bath. 1.88 g (5.0 mmol) pyromellitic diisopropyl dichloride dissolved in 5.0 g tetrahydrofuran was added while stirring and keeping the temperature of the reaction solution at 0° C. Thereafter, the content was stirred at 0° C. for 1 hour and then at 25° C. for 3 hours.

2.22 g (5.0 mmol) 2,2-bis(3,4-dicarboxyphenyl)hexafluoropropane acid dianhydride was added to the reaction solution and stirred at room temperature for 5 hours, so as to obtain a viscous polyamide acid ester-polyamide acid copolymer solution.

The copolymer solution was added to 500 ml of a mix solvent of methanol and water (methanol/water=1/1 in volume). The precipitated resin content was ground by a mixer, and thereafter, washed in methanol, and dried, to obtain 7.24 g polyimide precursor (amide acid precursor). The polyimide precursor had a weight-average molecular weight of 41,000, and its structure is shown in formula (16) below:

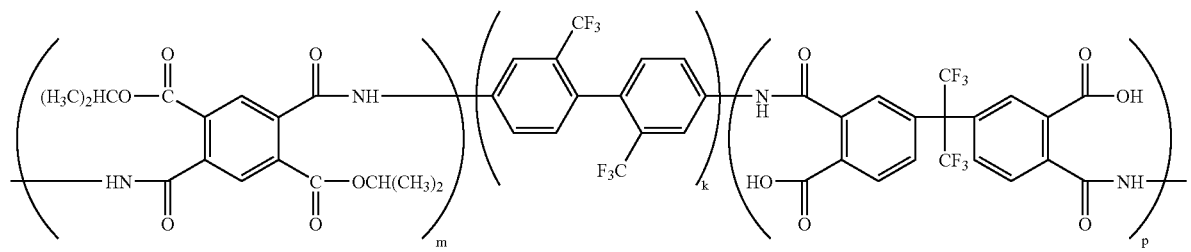

(16)

where each of k, m, and p is an integer greater than or equal to 1.

<Preparation and Evaluation of Resin Composition>

0.7 g of the foregoing polyimide precursor was dissolved in 6.3 g N-methylpyrolidone, and a 0.3 g photo acid generator represented by formula (12) was added. The content was stirred at room temperature for 1 hour. Thereafter, the content was filtered with a membrane filter to obtain a resin composition (having positive-type photosensitivity) in the form of solution in accordance with the present invention.

The obtained resin composition solution was directly applied onto a silicon wafer using a spin coater, dried at 100° C. for 30 minutes, to obtain a 5 μm-thick coating film (thin film). The film was exposed to light from a metal halide lamp (365 nm: 180 mJ/cm², 405 nm: 300 mJ/cm²) through a photomask, using a desktop UV exposure device (Product No. 26-1KS, manufactured by Newark Electronics).

After the exposure, the coating film was thermally treated at 100° C. for 30 minutes to develop it. As a developer liquid, an alkaline aqueous solution was used which was composed of a 2 mol/l (2 N) aqueous solution of sodium hydroxide, a 5% aqueous solution of potassium hydroxide, and a 1% aqueous solution of tetramethyl ammonium hydroxide. The coating film was immersed in the alkaline aqueous solution at 40° C. for 10 minutes. This completely confirmed that only the exposed parts had been eluted. After the development, the coating film was rinsed, and the obtained patterned film was checked for thickness and resolution, which turned out to be 4.5 μm and 10 μm respectively. It was thus concluded that a good pattern was produced.

Example 5

<Synthesis of Polyimide Precursor>

3.20 g (10.0 mmol) 2,2'-ditrifluoromethylbenzidine was introduced into a reaction container and dissolved by adding 35 g N-methylpyrolidone and 1.06 g (10.5 mmol) triethylamine. The reaction solution was cooled in ice bath. 1.73 g (5.0 mmol) pyromellitic diethyl dichloride dissolved in 5.0 g tetrahydrofuran was added while stirring and keeping the temperature of the reaction solution at 0° C. Thereafter, the content was stirred at 0° C. for 1 hour and then 25° C. for 3 hours.

1.55 g (5.0 mmol) 4,4'-oxydiphthalic dianhydride was added to the reaction solution and stirred at room temperature for 5 hours, so as to obtain a viscous polyamide acid ester-polyamide acid copolymer solution.

The copolymer solution was added to 500 ml of a mix solvent of methanol and water (methanol/water=1/1 in volume). The precipitated resin content was ground by a mixer, and thereafter, washed in methanol, and dried, to obtain 6.32 g polyimide precursor (amide acid precursor). The polyimide precursor had a weight-average molecular weight of 40,000, and its structure is shown in formula (17) below:

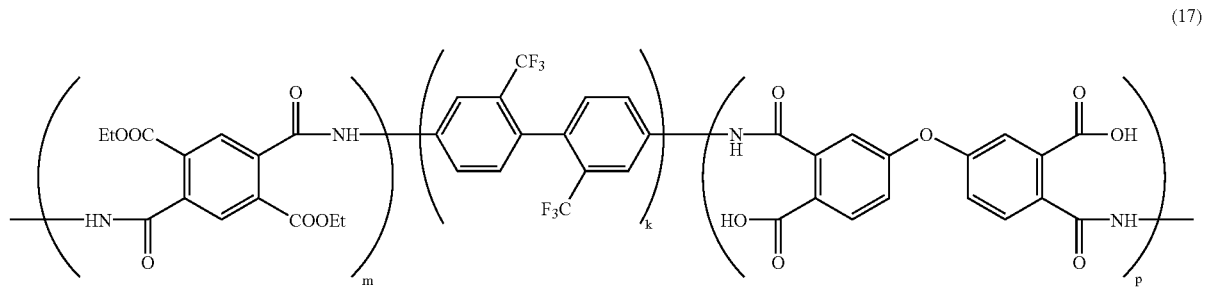

(17)

where each of k, m, and p is an integer greater than or equal to 1.

<Preparation and Evaluation of Resin Composition>

0.7 g of the foregoing polyimide precursor was dissolved in 6.3 g N-methylpyrolidone, and a 0.3 g photo acid generator represented by formula (12) was added. The content was stirred at room temperature for 1 hour. Thereafter, the content was filtered with a membrane filter to obtain a resin composition (having positive-type photosensitivity) in the form of solution in accordance with the present invention.

The obtained resin composition solution was directly applied onto a silicon wafer using a spin coater, dried at 100° C. for 30 minutes, to obtain a 5 μm-thick coating film (thin film). The film was exposed to light from a metal halide lamp (365 nm: 180 mJ/cm², 405 nm: 300 mJ/cm²) through a photomask, using a desktop UV exposure device (Product No. 26-1KS, manufactured by Newark Electronics).

After the exposure, the coating film was thermally treated at 100° C. for 30 minutes to develop it. As a developer liquid, an alkaline aqueous solution was used which was composed of a 2 mol/l (2 N) aqueous solution of sodium hydroxide, a 5% aqueous solution of potassium hydroxide, and a 1% aqueous solution of tetramethyl ammonium hydroxide. The coating film was immersed in the alkaline aqueous solution at 40° C. for 10 minutes. This completely confirmed that only the exposed parts had been eluted. After the development, the coating film was rinsed, and the obtained patterned film was checked for thickness and resolution, which turned out to be 4.6 μm and 10 μm respectively. It was thus concluded that a good pattern was produced.

In this manner, the polyimide precursor and the resin composition using the same in accordance with the present invention exhibits sufficient preservability and stability and successfully addresses problems of increased water absorbency and increased ionic impurities. Further, the polyimide precursor and the resin composition using the same, even when endowed with photosensitivity, shows excellent post-curing alkaline resistance, heat resistance, electrical properties, and adhesion.

Consequently, the polyimide precursor and the resin composition using the same in accordance with the present invention can be suitably used as an interlayer insulating film or buffer coat film in a semiconductor device, a passivation film in a liquid crystal display element, a positive-type etching resist, etc. The present invention hence is suitably applicable not only to resin and chemical industry fields, but also to space and aeronautics, OA equipment, and various electronic communications fields, especially, semiconductor fields, etc.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A polyimide precursor resin composition, comprising:
a polyamide precursor (A) containing at least one first structural unit (1); and
a polyimaide (B) containing at least one second structural unit (2),

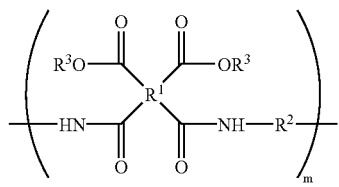

(1)

where $R^1$ is a tetravalent organic group, $R^2$ is a divalent organic group, $R^3$ is a monovalent organic group, and m is an integer greater than or equal to 1,

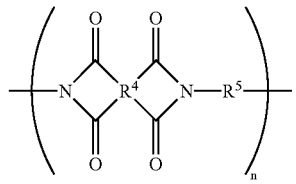

(2)

where $R^4$ is a tetravalent organic group, $R^5$ is a divalent organic group, and n is an integer greater than or equal to 1,
wherein the polyimide precursor resin composition has positive-type photosensitivity,
wherein the polyimide precursor resin composition contains a photo acid generator within a range of from 0.3 to 50 weight parts per combined 100 weight parts of the polyimide precursor (A) and the polyimide (B), wherein the photo acid generator has the property of producing acid on illumination by light and said property imparting to said polyimide precursor resin composition such positive-type photosensitivity that parts of said precursor resin composition when exposed to said light becomes removable by development with aqueous alkaline solution.

2. The polyimide precursor resin composition as set forth in claim 1, wherein the photo acid generator is selected from the group consisting of sulfonic acid producing onium salts.

3. The polyimide precursor resin composition as set forth in claim 2, wherein the sulfonic acid producing onium salts are selected from the group consisting of sulfonic acid producing sulfonium salts and sulfonic acid producing iodoaium salts.

4. The polyimide precursor resin composition as set forth in claim 1, wherein the photo acid generator is selected from the group consisting of sulfonic acid producing diazonium salts and sulfone producing bis (trichloromethyl) triazines.

5. The polyimide precursor resin composition as set forth in claim 1, wherein
the photo acid generator is compound (12)

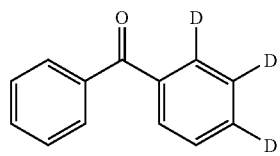

(12)

wherein (D) is an organic group identified by formula (13):

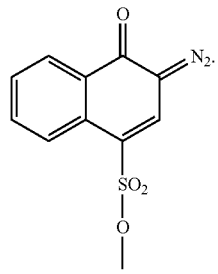

(13)

6. The polyimide precursor resin composition as set forth in claim 1, wherein the photo acid generator is naphthoquinone diazide.

* * * * *